(12) United States Patent
Stoneham

(10) Patent No.: US 10,636,477 B2
(45) Date of Patent: Apr. 28, 2020

(54) DIGITAL-UNIT INTERFACE

(71) Applicant: Edward B. Stoneham, Los Altos, CA (US)

(72) Inventor: Edward B. Stoneham, Los Altos, CA (US)

(73) Assignee: XTREMELUX CORPORATION, Campbell, CA (US)

( * ) Notice: Subject to any disclaimer, the term of this patent is extended or adjusted under 35 U.S.C. 154(b) by 0 days.

(21) Appl. No.: 16/337,777

(22) PCT Filed: Oct. 2, 2017

(86) PCT No.: PCT/US2017/054687
§ 371 (c)(1),
(2) Date: Mar. 28, 2019

(87) PCT Pub. No.: WO2018/064656
PCT Pub. Date: Apr. 5, 2018

(65) Prior Publication Data
US 2020/0020382 A1    Jan. 16, 2020

Related U.S. Application Data

(60) Provisional application No. 62/402,362, filed on Sep. 30, 2016.

(51) Int. Cl.
| G11C 7/00 | (2006.01) |
| G11C 11/4091 | (2006.01) |
| G11C 11/4072 | (2006.01) |
| G11C 11/4074 | (2006.01) |
| G11C 11/4099 | (2006.01) |

(52) U.S. Cl.
CPC ...... *G11C 11/4091* (2013.01); *G11C 11/4072* (2013.01); *G11C 11/4074* (2013.01); *G11C 11/4099* (2013.01)

(58) Field of Classification Search
CPC ..... G11C 11/4091; G11C 7/065; G11C 7/062; G11C 7/06; G11C 7/067
USPC .................................................. 365/207, 208
See application file for complete search history.

(56) References Cited

U.S. PATENT DOCUMENTS

| 2008/0013379 A1* | 1/2008 | Lin .......................... G11C 7/12 365/185.21 |
| 2009/0135651 A1* | 5/2009 | Kojima .................. G11C 7/062 365/185.16 |

* cited by examiner

*Primary Examiner* — Son T Dinh

(57) ABSTRACT

A digital-unit interface comprises a first node, a second node, a third node, and an amplifier assembly. The first node is connected to a pull-up resistor and is configured to be connected to the signal line of a transmission line connected to a first digital unit at a distal point. The second node is configured to be connected to a second reference electrical potential, a signal-return line of the transmission line, and a signal-return line of a second digital unit. The third node is configured to be connected to a signal line of the second digital unit. The amplifier assembly is configured to be connected between the first node and the third node and to transform between high electrical potentials on the first node and lower electrical potentials on the third node while the second digital unit communicates with the first digital unit.

30 Claims, 10 Drawing Sheets

DIGITAL-UNIT INTERFACE

RELATED APPLICATIONS

This application claims the benefit of U.S. Provisional Application No. 62/402,362, filed Sep. 30, 2016, which application is incorporated herein by reference in its entirety for all purposes.

BACKGROUND

In digital systems the need frequently arises for one digital unit to communicate with another. The communication is usually accomplished most economically through interconnections employing wires or other conductors. Such interconnections, especially if they are lengthy and exposed, may be prone to failure under the influence of electrical, magnetic, or electromagnetic interference or surges; electromagnetic reflections from impedance discontinuities; or misconnection of wires to sources of damaging voltages or currents. The simplest and least expensive digital interconnections, such as 1-Wire and I²C (Inter-Integrated Circuit) find use in systems in which communications are required over short distances. Typically operating at voltages of 5 volts or lower, these digital interconnections are prone to interference. They typically interconnect chips or modules that are designed for low-voltage logic and that are easily damaged by excessive voltages. For longer-distance digital communications utilizing exposed cables and user-accessible or user-serviceable connectors more expensive interconnection schemes, such as Ethernet and TIA-485 (Telecommunications Industry Association standard number 485 also known as Recommended Standard number 485 or RS-485), which utilize differential signaling, are frequently preferred due to their reduced susceptibility to interference, and their higher voltages. The chips or modules that they interconnect are often hardened to withstand surges such as electrostatic discharges and ground fault events and to withstand high voltages that might be applied to the interconnect wires due to cable insulation failures or accidental misconnections. Chips that implement these hardened interconnections currently cost a few dollars apiece, and one such chip is required for each digital unit being interconnected. Operation of each such chip requires a certain amount of electrical power.

SUMMARY

A digital-unit interface is described.

In an example, a digital-unit interface includes a first node, a second node, a third node, and an amplifier assembly.

The first node is configured to be connected to one end of a pull-up resistor, the pull-up resistor having another end connected to a first reference electrical potential, the first node being configured to be connected to a signal line of a transmission line connected to a first digital unit at a distal point on the transmission line, the first digital unit applying a high electrical potential alternating with a low electrical potential to the signal line of the transmission line during communication with a second digital unit.

The second node is configured to be connected to a second reference electrical potential, to a signal-return line of the transmission line, and to a signal-return line of the second digital unit, the second reference electrical potential being less than the first reference electrical potential.

The third node is configured to be connected to a signal line of the second digital unit, the second digital unit presenting between its signal line and its signal-return line a closed circuit alternating with an open circuit while the second digital unit is transmitting to the first digital unit and a continuous open circuit while the second digital unit is not transmitting to the first digital unit.

The amplifier assembly is configured to be connected between the first node and the third node, the amplifier assembly configured to transform between the high electrical potential on the first node and a medium electrical potential on the third node, the medium electrical potential being less than the high electrical potential and greater than the second reference electrical potential, and the amplifier assembly including at least a first amplifier having an input connected to the third node, the amplifier assembly being configured so that the electrical potential on the first node is dependent at least in part on an output of the first amplifier.

In another example, a digital-unit interface includes a first node, a second node, a third node, and an amplifier assembly.

The first node, second node, and third node are identical in description to those of the previous example.

The amplifier assembly is configured to be connected between the first node and the third node, the amplifier assembly configured to transform between the high electrical potential on the first node and a medium electrical potential on the third node, the medium electrical potential being less than the high electrical potential and greater than the second reference electrical potential, the amplifier assembly including a switch and a sensing circuit, and the sensing circuit including an amplifier, the sensing circuit being responsive to a change in the impedance between the signal line and the signal-return line of the second digital unit for operating the switch, the sensing circuit configured to close the switch whenever the second digital unit is presenting between its signal line and its signal-return line a closed circuit and to open the switch whenever the second digital unit is presenting between its signal line and its signal-return line an open circuit.

DETAILED DESCRIPTION OF VARIOUS EMBODIMENTS

The disclosed circuits and architectures for a digital-unit interface will become better understood through review of the following detailed description in conjunction with the drawings. The detailed description and drawings provide examples of the various embodiments described herein. Those skilled in the art will understand that the disclosed examples may be varied, modified, and altered without departing from the scope of the disclosed structures. Many variations are contemplated for different applications and design considerations; however, for the sake of brevity, not every contemplated variation is individually described in the following detailed description.

Some embodiments of a digital-unit interface are now described in more detail with reference to FIGS. 1-15. In the various figures, like or similar features may have the same reference labels. Each figure may include one or more views of objects.

Throughout this description the term "node" may be defined as a point in a circuit, to which point one or more terminals of circuit elements may be electrically connected and have substantially identical electrical potential or voltage. The term "port" may be defined as a set of two nodes on a single digital unit that is operably configured to effect communications with other digital units properly connected to those nodes when the potential difference between the nodes undergoes changes over time in accordance with a prescribed communications protocol.

Figure 1:
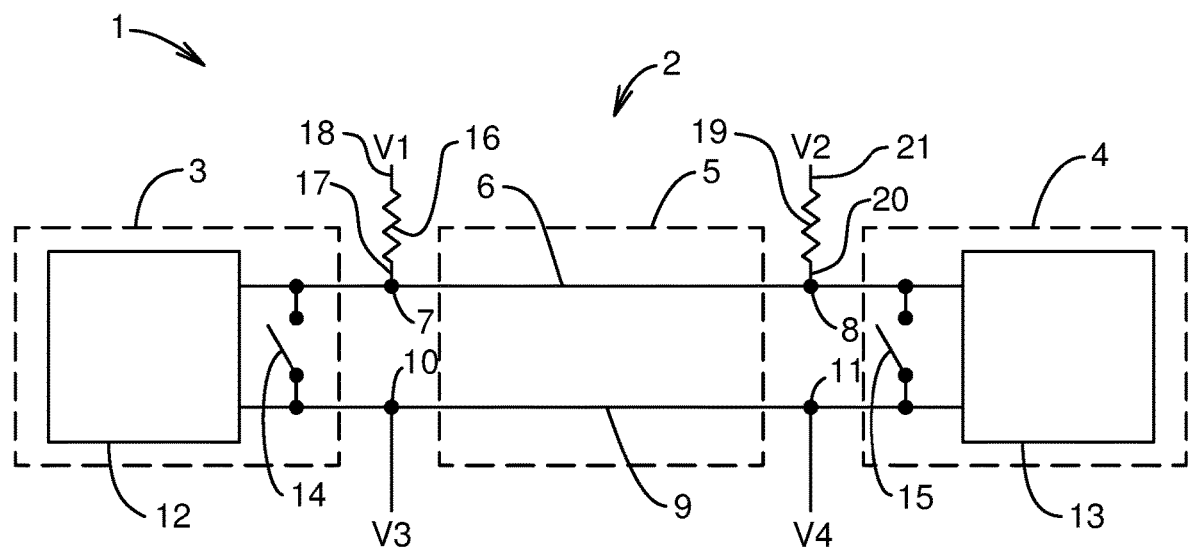
FIG. 1 is a schematic diagram of an example of a system employing a simple digital interconnection scheme.

FIG. 1 shows a schematic diagram of a system 1 that includes a simple digital interconnection 2 of the existing art. System 1 also includes a first digital unit 3 and a second digital unit 4. Digital interconnection 2 includes a transmission line 5, which includes a signal conductor 6 that connects electrically to first digital unit 3 at a first node 7 and to second digital unit 4 at a second node 8 and also includes a return conductor 9 that connects electrically to first digital unit 3 at a third node 10 and to second digital unit 4 at a fourth node 11. First digital unit 3 includes a first digital circuit 12, and second digital unit 4 includes a second digital circuit 13. First digital unit 3 also contains a first switch 14, and second digital unit 4 also contains a second switch 15. Included in digital interconnection 2 is a first pull-up resistor 16, a first end 17 of which is electrically connected to first node 7 and a second end 18 of which is maintained by external circuitry (not shown) at a substantially constant electrical potential V1. Also included in digital interconnection 2 may be a second pull-up resistor 19, a first end 20 of which may be electrically connected to second node 8 and a second end 21 of which may be maintained by external circuitry (not shown) at a substantially constant electrical potential V2. Third node 10 may be maintained by external circuitry (not shown) at a substantially constant electrical potential V3, and fourth node 11 may be maintained by external circuitry (not shown) at a substantially constant electrical potential V4.

Switches, such as first and second switches 14 and 15 respectively, may be any type of switching device, such as, but not limited to, a mechanical switch, a relay, or a transistor or electro-optical switching device or other semiconductor switching device, that can be placed in either of two conducting states, one of which permits negligible or operably small electrical current flow through the switch under operating conditions in system 1 and the other of which permits negligible or operably small electrical potential difference across the switch under operating conditions in system 1. Resistors, such as first and second pull-up resistors 16 and 19 respectively, may be linear resistor elements obeying Ohm's Law or may be nonlinear elements, such as, but not limited to, transistors, diodes, or other semiconductor devices or circuits, the electrical currents through which may or may not depend on the electrical potential differences across them. Conductors, such as signal conductor 6 and return conductor 9, may include, without limitation, electrical wires, metal traces on printed-circuit boards, conductive paths in semiconductors, and/or elements having some intentional electrical resistance, and may have the property that potential drops across lengths of the conductor under operating conditions of system 1 are not sufficient to prevent the operation of system 1. Similar definitions of switches, resistors, and conductors may be assumed for all applications of these terms in the remainder of this specification.

Figure 2:
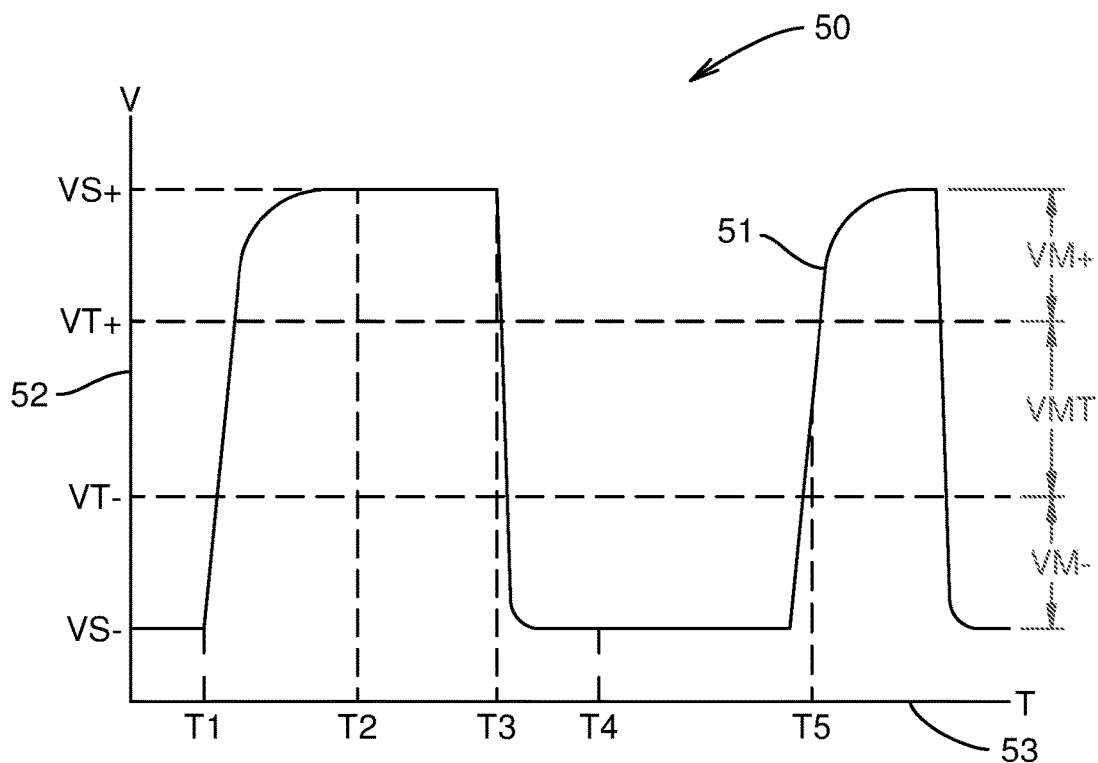
FIG. 2 is a graph of electrical potential versus time defining certain characteristics of a typical digital signal waveform and its relationship to typical threshold potentials in a system such as that shown in FIG. 1.

In the practical operation of system 1 electrical potentials V1 and V2 may be substantially equal to each other, and electrical potentials V3 and V4 may be substantially equal to each other but substantially different from electrical potentials V1 and V2. When first and second switches 14 and 15 respectively are both open, the electrical potentials at first and second nodes 7 and 8 respectively may both settle at an electrical potential VS+ substantially near or between electrical potentials V1 and V2. When first switch 14 and/or second switch 15 is closed, the electrical potentials at first and second nodes 7 and 8 respectively may both settle at an electrical potential VS− substantially equal to electrical potentials V3 and V4. First digital unit 3 may signal second digital unit 4 by repeatedly closing and opening first switch 14 in an appropriate time sequence as prescribed by a digital communications protocol while second switch 15 remains open. A graph 50 in FIG. 2 plots a curve 51 of the electrical potential at first node 7 versus time during an interval of time in which first digital unit 3 is signaling second digital unit 4. The electrical potential V is given by a vertical axis 52 of graph 50, and the time T is given by a horizontal axis 53. As demonstrated for example by a curve 51, the opening of first switch 14 at a time T1 may result at a later time T2 in an electrical potential on first node 7 substantially equal to VS+. Also, the closing of first switch 14 at a time T3 may result at a later time T4 in an electrical potential on first node 7 substantially equal to VS−.

In typical applications the length of transmission line 5 may be short enough that the electrical potential at second node 8 closely follows the electrical potential shown by curve 51 for node 7. It is a characteristic of digital communications ports on binary digital devices such as first digital unit 3 and second digital unit 4 that there exists a threshold level for the potential difference across the port beyond which the potential difference registers as a "1" and that there exists a threshold level beyond which in the opposite-going sense the potential difference registers as a "0." These threshold levels may vary from unit to unit or from time to time, but such variations are necessarily small relative to the designed peak-to-peak potential difference excursions of the digital signal. FIG. 2 indicates a threshold level VT+ above which a potential difference between second node 8 and fourth node 11 registers a "1" and a threshold level VT− below which a potential difference between second node 8 and fourth node 11 registers a "0." The lesser of a magnitude of VM+, the difference between VS+ and VT+, and a magnitude of VM−, the difference between VT− and VS−, may be termed the noise margin, a measure of the susceptibility of a digital interconnection to noise, transients, voltage variations, and other causes of voltage errors. The magnitude of a threshold margin VMT, the difference between VT+ and VT−, plays a role in determining the stability and noise-susceptibility of a digital interconnection 2 in system 1 when the signal potential difference, as demonstrated by curve 51 at a time T5 is transiting between VT− and VT+.

Figure 3A:
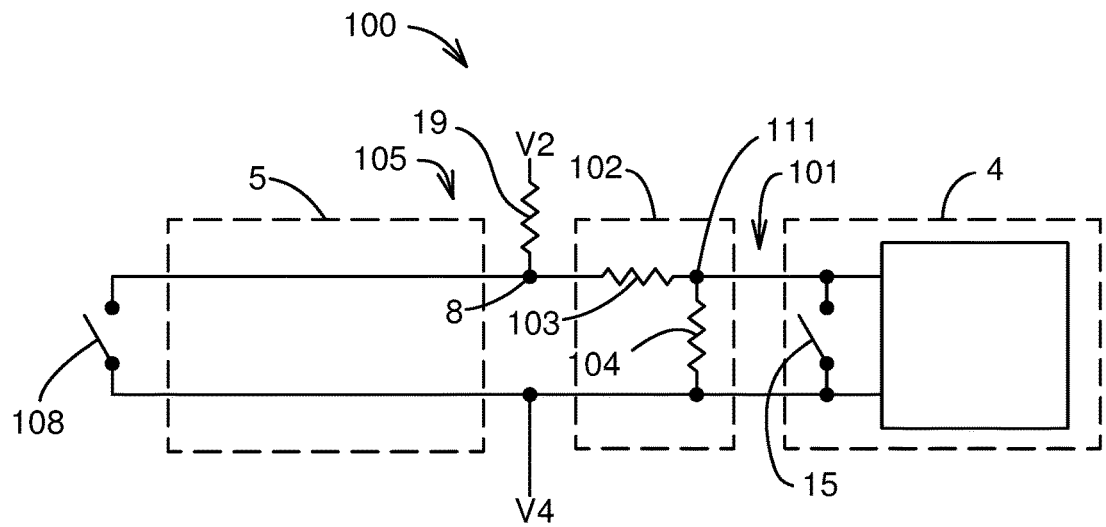
FIG. 3A shows a circuit diagram of an example of a voltage-dividing digital communications circuit.

Increasing noise margin and threshold margin together obviously requires an increase in the signal peak-to-peak voltage VS+−VS−. A voltage-dividing digital communications circuit 100 as shown in FIG. 3A can transform a high-voltage signal (one with higher peak-to-peak voltage) on a transmission line 5 to a lower-voltage signal that may be required at a digital port 101 of second digital unit 4.

Voltage-dividing digital communications circuit 100 may, for example, include a voltage-dividing interface 102 consisting of two resistors—a first divider resistor 103, and a second divider resistor 104—connected in series between second node 8 and an electrical potential V4. A digital port 101 may be connected across second divider resistor 104, and transmission line 5 may be connected across the series combination of first divider resistor 103 and second divider resistor 104. Persons skilled in the art will recognize the combination of first divider resistor 103 and second divider resistor 104 as a voltage divider that, if negligibly loaded by digital port 101, will produce a potential drop across digital port 101 that is a fixed fraction of the potential drop across an end 105 of transmission line 5.

Figure 3B:
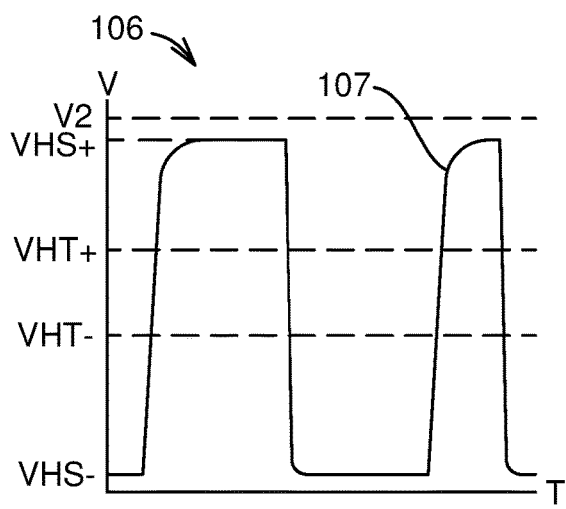
FIG. 3B shows a graph of a signal waveform and the noise and threshold margins on the high-voltage side of the voltage-dividing interface during digital transmission to the digital unit of data from another digital unit.

A high-voltage transmission graph 106 in FIG. 3B plots, as an example, the potential of a high-voltage signal 107 at second node 8 over time when a high-voltage switch 108 is being actuated to generate the high-voltage signal 107. In this example, the value of second pull-up resistor 19 is 100 kilohms, the value of first divider resistor 103 is 1 megohm, and the value of second divider resistor 104 is 500 kilohms. A peak signal potential VHS+ of high-voltage signal 107 is 6.25 percent lower than electrical potential V2 due to the loading on second pull-up resistor 19 by the series combination of first divider resistor 103 and second divider resistor 104. A base signal potential VHS− of high-voltage signal 107 is substantially equal to electrical potential V4.

Figure 3C:
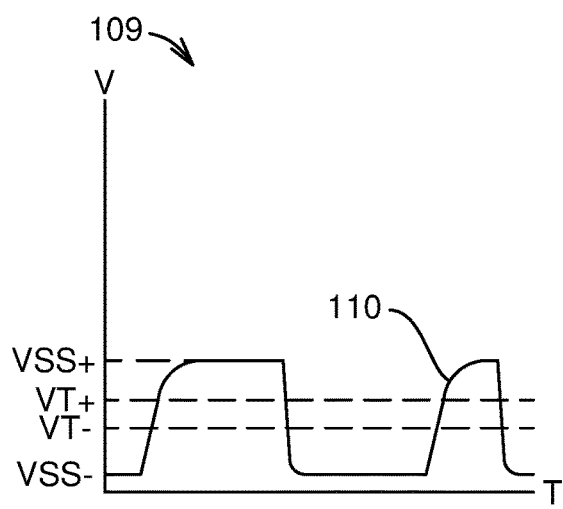
FIG. 3C shows a graph of a signal waveform and the noise and threshold margins on the low-voltage side of the voltage-dividing interface during digital reception by the digital unit of data from another digital unit.

In FIG. 3C a low-voltage reception graph 109 plots, on potential and time axes identical to those of high-voltage transmission graph 106, the potential of a resulting low-voltage signal 110 at digital port 101 as a function of time in this example. A base potential VSS− of low-voltage signal 110 is substantially equal to electrical potential V4. A peak potential VSS+ of low-voltage signal 110 is such that the peak-to-peak potential VSS+−VSS− of low-voltage signal 110 is one-third of the peak-to-peak potential VHS+−VHS− of high-voltage signal 107.

Also shown on low-voltage reception graph 109 are threshold levels VT+ and VT− for digital port 101 of second digital unit 4. Shown on high-voltage transmission graph 106 is a high-voltage threshold level VHT+, which is the potential at second node 8 that results in threshold potential VT+ at a low-voltage node 111. Also shown on high-voltage transmission graph 106 is the low-voltage threshold level VHT−, which is the potential at second node 8 that results in threshold potential VT− at low-voltage node 111. The high-voltage noise margin, which is equal to the lesser of the magnitudes of the differences VHS+−VHT+ and VHT−−VHS−, is equal to thrice the low-voltage noise margin, which is equal to the lesser of the magnitudes of the differences VSS+−VT+ and VT−−VSS−. The high-voltage threshold margin, which is equal to the magnitude of the difference VHT+−VHT−, is thrice the low-voltage threshold margin, which itself is equal to the magnitude of the difference VT+−VT−. It follows from this example, then, that voltage-dividing interface 102 can achieve the objective of increasing the noise margin and threshold margin for transmission of digital signals from a transmission line 5 to a digital port 101.

Figure 3E:
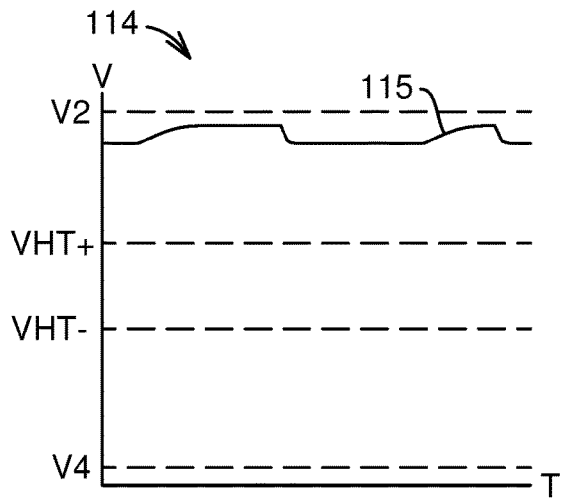
FIG. 3E shows a graph of a signal waveform and the noise and threshold margins on the high-voltage side of the voltage-dividing interface during digital reception of data from the digital unit by another digital unit.
Figure 3D:
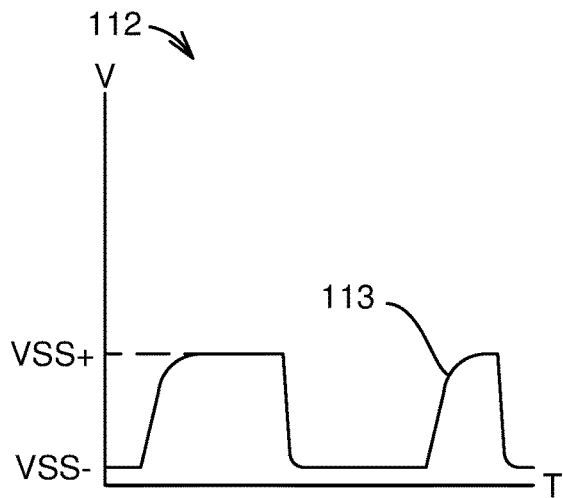
FIG. 3D shows a graph of a signal waveform on the low-voltage side of the voltage-dividing interface during digital transmission of data from the digital unit to another digital unit.

Voltage-dividing interface 102 does not, however, allow the transmission of effective digital signals from digital port 101 to transmission line 5. A low-voltage transmission graph 112 in FIG. 3D shows, as an example, a low-side signal 113 generated at low-voltage node 111 through actuations of second switch 15 when high-voltage switch 108 remains open. A high-voltage reception graph 114 in FIG. 3E shows, for the current example circuit, a high-side signal 115 that results at second node 8. Low-voltage transmission graph 112 has potential and time axes identical to those of low-voltage reception graph 109. Likewise, high-voltage reception graph 114 has potential and time axes identical to those of high-voltage transmission graph 106 and shows the same threshold levels as shown in high-voltage transmission graph 106. The high-side signal 115 is lower in peak-to-peak magnitude than low-side signal 113. In fact, high-side signal 115 fails to cross the thresholds and therefore has no noise margin. It follows that voltage-dividing interface 102 does not increase noise margin for transmission of a signal from digital port 101 to transmission line 5. It will be clear to persons skilled in the art that voltage-dividing digital communications circuit 100 may achieve the higher noise margin objective for transmission of digital signals in one direction but cannot achieve this objective for transmission of digital signals in the other direction.

Figure 4A:
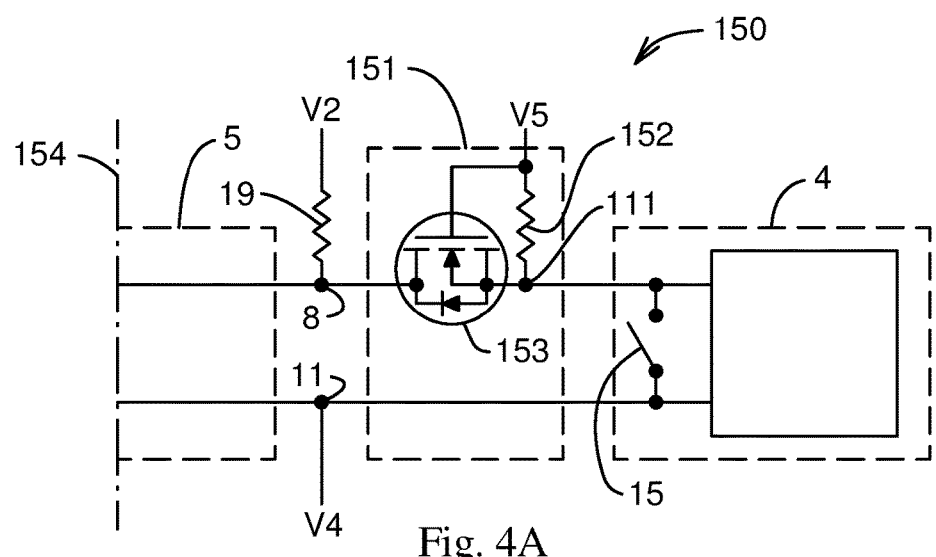
FIG. 4A shows a circuit diagram of an example of a logic level conversion circuit.

FIG. 4A shows an example of a logic level conversion circuit 150 that is capable of bidirectional transmission of digital signals when the peak potential of a signal on one side of a conversion interface 151 is different from the maximum peak potential allowed on the other side of conversion interface 151. Conversion interface 151 may include a low-side pull-up resistor 152 and a MOSFET (metal-oxide-semiconductor field-effect transistor) 153, assumed to be an N-channel type in this case, connected as shown in FIG. 4A. Transmission line 5 terminates at second node 8 connected to second pull-up resistor 19 and at fourth node 11 connected to the low end of second switch 15. Fourth node 11 is held at electrical potential V4 by external circuitry not shown. Electrical potential V2 is applied by external circuitry not shown to second pull-up resistor 19. A low-side pull-up potential V5 is applied by external circuitry not shown to low-side pull-up resistor 152. As indicated by symmetry line 154, circuitry identical to logic level conversion circuit 150 is considered to exist at the distal end (not shown) of transmission line 5.

Figure 4B:
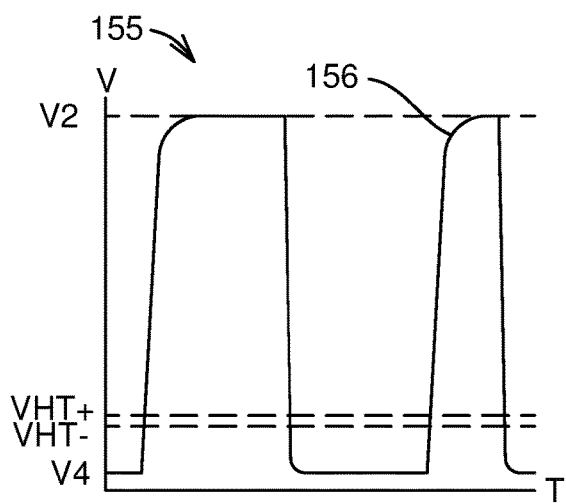
FIG. 4B shows a graph of a signal waveform and the noise and threshold margins on the high-voltage side of the conversion interface during digital transmission to the digital unit of data from another digital unit.

A logic-level-conversion-circuit high-voltage transmission graph 155 in FIG. 4B plots, as an example, the potential of a high-voltage signal 156 at second node 8 over time when circuitry at the distal end of transmission line 5 alternately shorts and opens the two conductors of the high-voltage transmission line at the distal end. As shown in logic-level-conversion-circuit high-voltage transmission graph 155, high-voltage signal 156 alternates between electrical potential V4 and electrical potential V2.

Figure 4C:
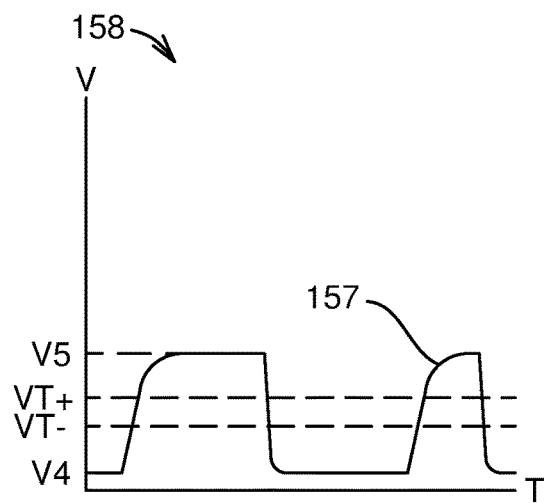
FIG. 4C shows a graph of a signal waveform and the noise and threshold margins on the low-voltage side of the conversion interface during digital reception by the digital unit of data from another digital unit.

Providing second switch 15 remains open, the potential at low-voltage node 111 may respond to the high-voltage signal 156 as shown by low-voltage signal curve 157 in a logic-level-conversion-circuit low-voltage reception graph 158 in FIG. 4C. In this example, it is assumed that MOSFET 153 has a positive threshold voltage that, when added to the forward voltage of its body diode, totals less than the difference between low-side pull-up potential V5 and electrical potential V4. In this case the potential at low-voltage node 111 may alternate between electrical potential V4 and low-side pull-up potential V5.

The threshold voltages VT+ and VT− characteristic of second digital unit 4 are shown in logic-level-conversion-circuit low-voltage reception graph 158 in FIG. 4C. Potential levels on second node 8 that produce potentials VT+ and VT− at low-voltage node 111 are shown as VHT+ and VHT− in logic-level-conversion-circuit high-voltage transmission graph 155. As readily found through circuit modeling by those skilled in the art, when MOSFET 153 acts substantially as an on-off switch between second node 8 and low-voltage node 111, potential level VHT+ can be no higher than potential VT+, potential level VHT− can be no higher than potential VT−, and the difference between potential level VHT+ and potential level VHT− can be no greater than the difference between potentials VT+ and VT−. It follows that, although the margin between the upper peaks of the signal and the upper threshold potential is much greater on the high-voltage side of conversion interface 151 than on the low-voltage side, the margin between the lower levels of the signal and the lower threshold potential is no greater on the high-voltage side than on the low-voltage side. In the example shown in FIG. 4A the noise margin on the high-voltage side is not improved, and the threshold margin is actually decreased, relative to the noise and threshold margins respectively on the low-voltage side.

Figure 4E:
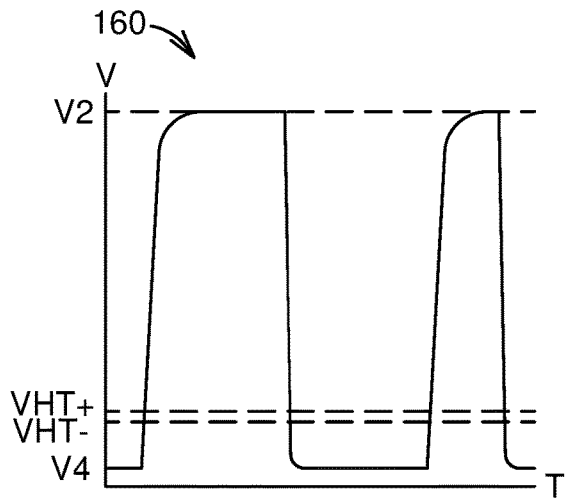
FIG. 4E shows a graph of a signal waveform and the noise and threshold margins on the high-voltage side of the conversion interface during digital reception of data from the digital unit by another digital unit.
Figure 4D:
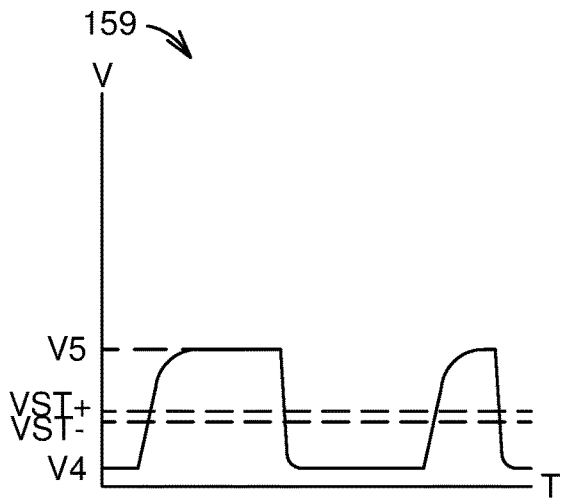
FIG. 4D shows a graph of a signal waveform and the noise and threshold margins on the low-voltage side of the conversion interface during digital transmission of data from the digital unit to another digital unit.

A logic-level-conversion-circuit low-voltage transmission graph 159 in FIG. 4D and a logic-level-conversion-circuit high-voltage reception graph 160 in FIG. 4E show the results of signaling with second switch 15 when the identical switch at the distal end of transmission line 5 (per symmetry line 154) is maintained in its open state. The threshold potentials VHT+ and VHT− are the same in the logic-level-conversion-circuit high-voltage reception graph 160 as in the logic-level-conversion-circuit high-voltage transmission graph 155, since they are set by the characteristics of the circuit at the distal end of transmission line 5, which is identical to logic level conversion circuit 150. In other words, the same potential VHT+ on second node 8 that produces threshold potential VT+ on low-voltage node 111 also produces threshold potential VT+ on the low-voltage node of any other logic level conversion circuit connected to transmission line 5 that is identical to logic level conversion circuit 150. Likewise, the same potential VHT− on second node 8 that produces threshold potential VT− on low-voltage node 111 also produces threshold potential VT− on the low-voltage node of any other logic level conversion circuit connected to transmission line 5 that is identical to logic level conversion circuit 150.

Logic-level-conversion-circuit low-voltage transmission graph 159 shows a low-voltage positive-going transmission threshold VST+ defined as the potential at low-voltage node 111 that produces potential VHT+ at second node 8 whenever transmission line 5 is under the control of logic level conversion circuit 150. Logic-level-conversion-circuit low-voltage transmission graph 159 also shows a low-voltage negative-going transmission threshold VST− defined as the potential at low-voltage node 111 that results in potential VHT− at second node 8 whenever transmission line 5 is under the control of logic level conversion circuit 150. According to circuit theory, as will be clear to one skilled in the art, in the case in which the gate threshold voltage of MOSFET 153 is lower than the difference between low-side pull-up potential V5 and threshold potential VHT+, the threshold potentials VST+ and VST− may be nearly identical to the respective threshold potentials VHT+ and VHT− on the high-voltage side shown in logic-level-conversion-circuit high-voltage reception graph 160.

The result for logic level conversion circuit 150 is that the circuit can communicate in both directions, but the desired increases in noise margin and threshold margin are not achieved.

Figure 5A:
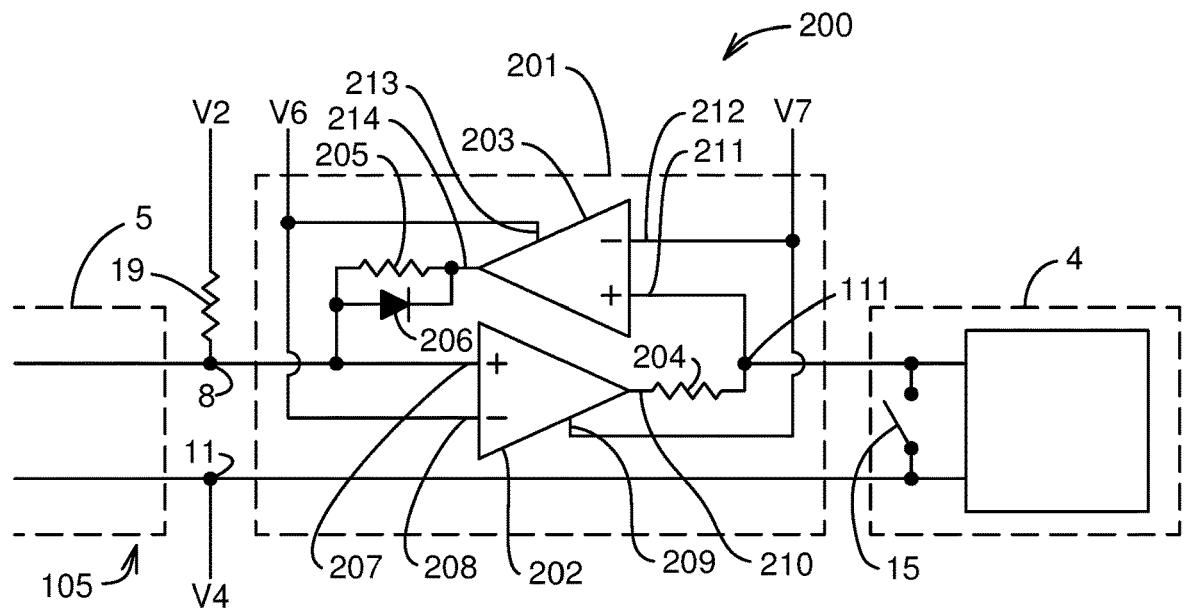
FIG. 5A shows a circuit diagram of an example of an amplifier-scaled circuit.
Figure 5B:
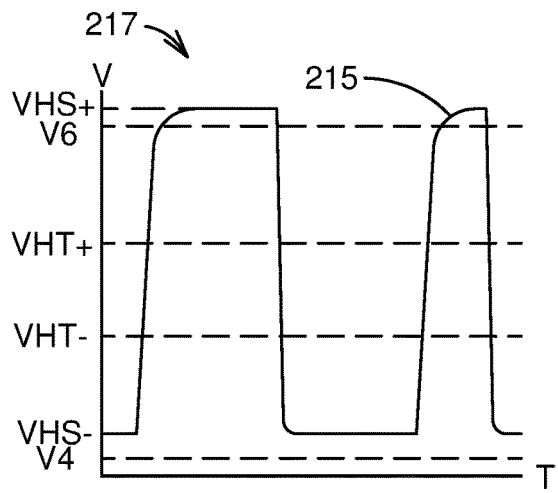
FIG. 5B shows a graph of a signal waveform and the noise and threshold margins on the high-voltage side of the amplifier-scaling interface during digital transmission to the digital unit of data from another digital unit.
Figure 5C:
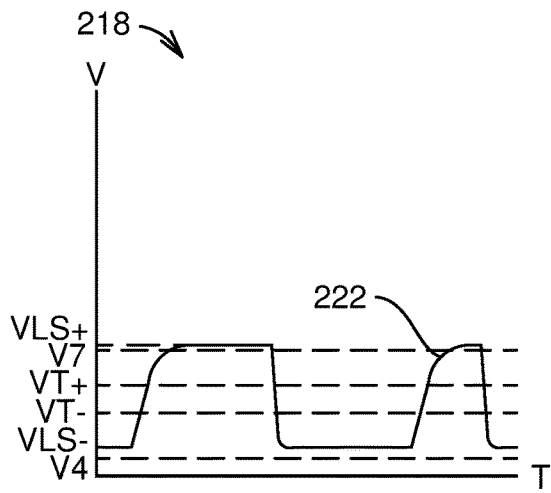
FIG. 5C shows a graph of a signal waveform and the noise and threshold margins on the low-voltage side of the amplifier-scaling interface during digital reception by the digital unit of data from another digital unit.
Figure 5E:
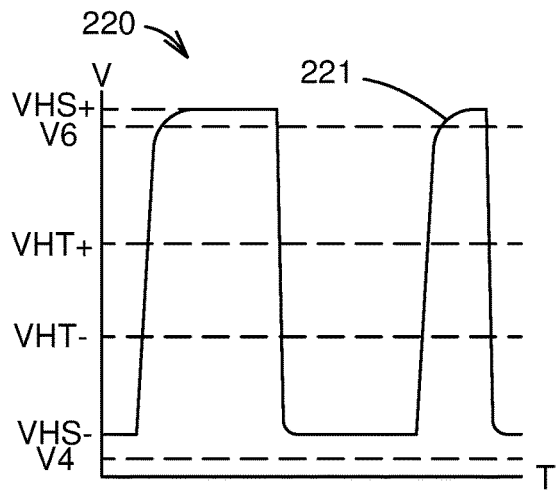
FIG. 5E shows a graph of a signal waveform and the noise and threshold margins on the high-voltage side of the amplifier-scaling interface during digital reception of data from the digital unit by another digital unit.
Figure 5D:
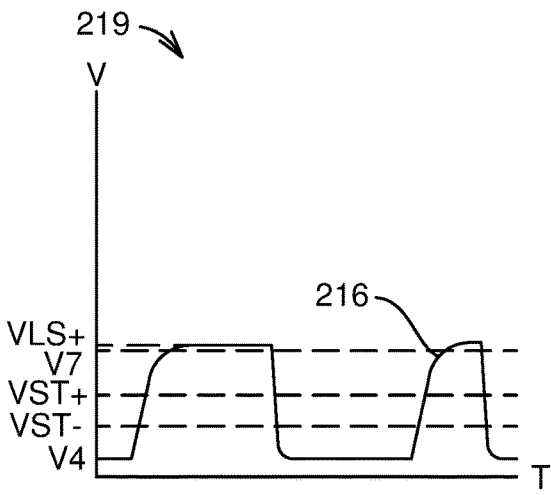
FIG. 5D shows a graph of a signal waveform and the noise and threshold margins on the low-voltage side of the amplifier-scaling interface during digital transmission of data from the digital unit to another digital unit.

FIG. 5A shows a circuit of an example of an amplifier-scaled circuit 200, which may comprise the end 105 of transmission line 5 terminated at second node 8 with second pull-up resistor 19 going to electrical potential V2 and at fourth node 11 with a connection directly to electrical potential V4, second digital unit 4 including second switch 15, and an amplifier-scaling interface 201 that may connect as shown in FIG. 5A between the end 105 of transmission line 5 and second switch 15. Amplifier-scaling interface 201 may include a first difference amplifier 202 and a second difference amplifier 203 and may also include a first output resistance 204, and/or a second output resistance 205, and/or an output rectifier 206.

First and second difference amplifiers 202 and 203 respectively may be defined by characteristics that will be described as follows with reference to first difference amplifier 202 in FIG. 5A.

First difference amplifier 202 may include a first non-inverting input 207, a first inverting input 208, a first reference terminal 209, and a first output terminal 210. Over an operating range suitable for operation of amplifier-scaling interface 201, first difference amplifier 202 may produce an electrical potential at first output terminal 210 that differs from the potential at first reference terminal 209 by an amount proportional to the difference between the potential at first non-inverting input 207 and the potential at first inverting input 208. The proportionality constant may be a substantially constant gain factor $G_1$. The electrical impedance of first output terminal 210 may be low enough to be negligible or to at least allow proper operation of amplifier-scaling interface 201. The electrical impedances at first non-inverting input 207 and first inverting input 208 may be high enough to be inconsequential or to at least allow proper operation of amplifier-scaling interface 201.

Second difference amplifier 203 may have the same characteristics as those described for first difference amplifier 202, but the value $G_2$ of the gain factor of second difference amplifier 203 may differ from the value $G_1$ of the gain factor of first difference amplifier 202. Second difference amplifier 203 may include a second non-inverting input 211, a second inverting input 212, a second reference terminal 213, and a second output terminal 214.

Difference amplifiers as described above are well known to those skilled in the art.

As shown in FIG. 5A the first inverting input 208 of first difference amplifier 202 and the second reference terminal 213 of second difference amplifier 203 may both be connected to a first reference potential V6 supplied by external circuitry not shown, and the second inverting input 212 of second difference amplifier 203 and the first reference terminal 209 of first difference amplifier 202 may both be connected to a second reference potential V7, which may also be supplied by external circuitry not shown.

The second output terminal 214 of second difference amplifier 203 may be connected to second node 8 through second output resistance 205 and/or through output rectifier 206. The first output terminal 210 of first difference amplifier 202 may be connected to low-voltage node 111 through first output resistance 204 or may be directly connected to low-voltage node 111 if first difference amplifier 202 already has sufficient output resistance or current limiting. The second non-inverting input 211 of second difference amplifier 203 may be connected to low-voltage node 111, and the first non-inverting input 207 of first difference amplifier 202 may be connected to second node 8.

In various implementations of amplifier-scaled circuit 200 second pull-up resistor 19, second switch 15, first output resistance 204, second output resistance 205, output rectifier 206, and the quantities $G_1$, $G_2$, V2, V4, V6, and V7 may each have many different values and characteristics. For the sake of illustrating the operation of amplifier-scaled circuit 200 a particular set of conditions on the values and characteristics of these components will be selected in what follows to serve as an example.

Let second pull-up resistor 19 have a value of 100 kilohms. Let first output resistance 204, including the output resistance of first output terminal 210 of first difference amplifier 202, be substantially linear with a value of 10,000 ohms. Let second switch 15 have a resistance less than 50 ohms when closed and a resistance greater than 10 megohms when open. Let the impedances of the non-inverting inputs and the inverting inputs of first and second difference amplifiers 202 and 203 respectively each be at least 10 megohms. Let second output resistance 205, in parallel with the leakage resistance of output rectifier 206 be greater than 10 megohms, and let output rectifier 206 have a forward voltage of 0.5 volts under the operating conditions of amplifier-scaled circuit 200. Let electrical potential V2, electrical potential V4, first reference potential V6, and second reference potential V7 be 10 volts, 0 volts, 9.5 volts, and 3.1 volts respectively. Finally, let gains $G_1$ and $G_2$, of first difference amplifier 202 and second difference amplifier 203 be 0.3 and 3 respectively.

The results for an example incoming high-voltage waveform 215 and an example outgoing low-voltage waveform 216 are shown in FIGS. 5B, 5C, 5D, and 5E in an amplifier-scaling-interface high-voltage transmission graph 217, an amplifier-scaling-interface low-voltage reception graph 218, an amplifier-scaling-interface low-voltage transmission graph 219, and an amplifier-scaling-interface high-voltage reception graph 220, following the same convention as for the corresponding graphs in FIGS. 4B, 4C, 4D, and 4E. As before, the node for which the potentials are plotted in amplifier-scaling-interface high-voltage transmission and reception graphs 217 and 220 is second node 8, and the node for which the potentials are plotted in amplifier-scaling-interface low-voltage transmission and reception graphs 218 and 219 is low-voltage node 111. To be consistent, incoming high-voltage waveform 215 in amplifier-scaling-interface high-voltage transmission graph 217 is identical to an outgoing high-voltage waveform 221 in amplifier-scaling-interface high-voltage reception graph 220. Outgoing high-voltage waveform 221 is produced by the outgoing low-voltage waveform 216, shown in amplifier-scaling-interface low-voltage transmission graph 219, that results from the alternating switching of second switch 15. Incoming high-voltage waveform 215 is, therefore, the waveform that would be presented at second node 8 by another node identical to amplifier-scaled circuit 200 if this other node were connected to transmission line 5 and were the one node presenting signals at the time.

A potential VHS+ at the positive peaks of incoming high-voltage waveform 215 in this example is 0.5 volts higher than first reference potential V6, and a potential VHS− at the minima of incoming high-voltage waveform 215 is 0.7 volts higher than electrical potential V4. Correspondingly, a potential VLS+ at the positive peaks of incoming low-voltage waveform 222 is 0.15 volts higher than second reference potential V7, and a potential VLS− at the minima of incoming low-voltage waveform 222 is 0.25 volts higher than electrical potential V4.

In the current example the noise margin at second node 8 is 2.8 volts, which is more than twice as high as the maximum 1.3-volt noise margin of second digital unit 4. In addition, the threshold margin is 2.7 volts, which is more than three times as high as the 0.7-volt threshold margin of second digital unit 4.

Figure 6:
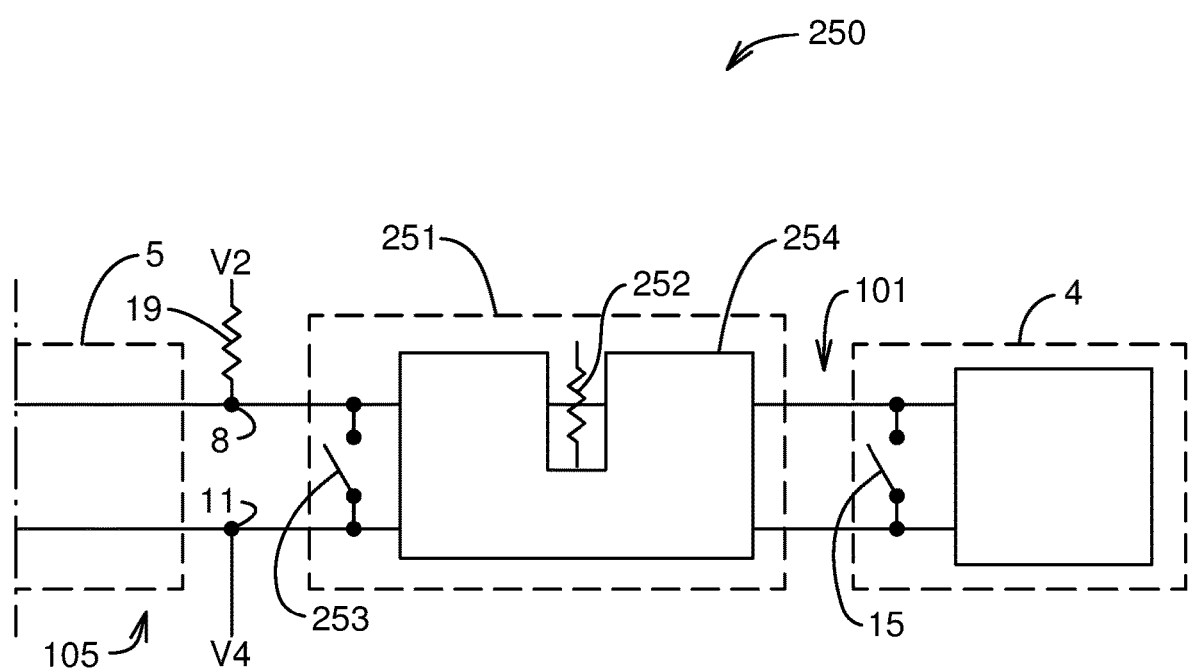
FIG. 6 shows an example of a schematic diagram of a general interface in which the activation of a switch is based on sensing by the interface circuitry of the output state of the second digital unit.

FIG. 6 shows an example of a sensing based circuit 250. Sensing-based circuit 250 may include the end 105 of transmission line 5, second pull-up resistor 19, and second digital unit 4, connections among which and to second node 8, fourth node 11, electrical potential V2, and electrical potential V4 may be the same as described previously with reference to FIGS. 4A and 5A. Sensing-based circuit 250 may also include a sensing-based interface 251, which may include a voltage attenuator 252, a sensing-based switch 253, and a sensing circuit 254.

Sensing-based switch 253 may be connected at one end to second node 8 and at another end to fourth node 11. Sensing-based switch 253 may alternately open and short the end 105 of transmission line 5. Sensing-based switch 253 thus may communicate through transmission line 5 in the same manner that second switch 15 may communicate through transmission line 5 in the system shown in FIG. 1, but sensing-based switch 253 may be capable of switching higher voltages than may second switch 15.

Voltage attenuator 252 may be configured to reduce high voltages on transmission line 5 to lower voltages allowable by second digital unit 4.

Sensing circuit 254 may be configured to sense the state of second switch 15 and to actuate sensing-based switch 253 in response to changes in the state of second switch 15. Sensing circuit 254 may cause sensing-based switch 253 to be open whenever second switch 15 is sensed to be open and may cause sensing-based switch 253 to be closed whenever second switch 15 is sensed to be closed.

Determining whether second switch 15 is open or closed is complicated by the fact that incoming signals from other nodes on transmission line 5 produce electrical potential variations within the interface similar to the intended electrical potential variations produced by second switch 15. In addition, sensing-based switch 253 itself produces those electrical potential variations. Simply examining a potential in the interface, such as the potential on low-voltage node 111, may not be sufficient for determining the state of second switch 15. Sensing circuit 254 may need additional inputs to correctly respond to the state of second switch 15.

Figure 7A:
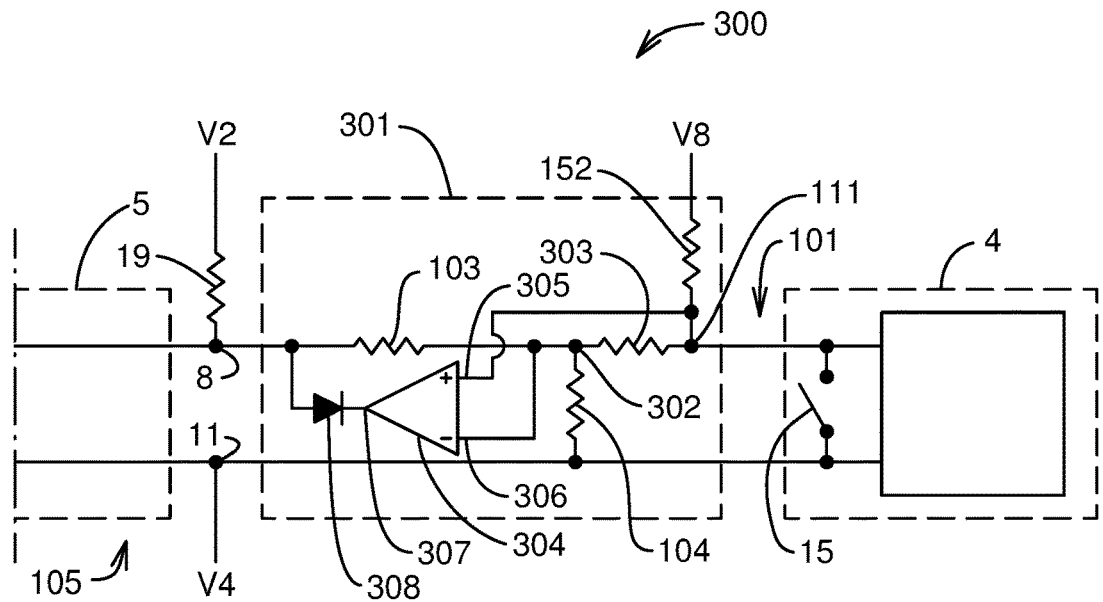
FIG. 7A shows a circuit diagram of a first example of a sensor-based circuit.
Figure 7B:
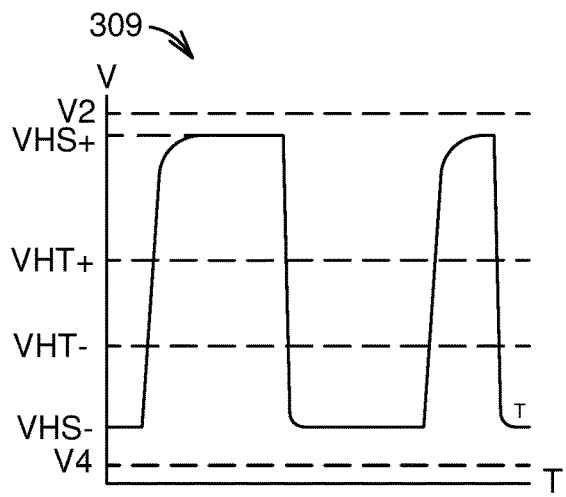
FIG. 7B shows a graph of a signal waveform and the noise and threshold margins on the high-voltage side of the first example of a sensor-based interface during digital transmission to the digital unit of data from another digital unit.
Figure 7C:
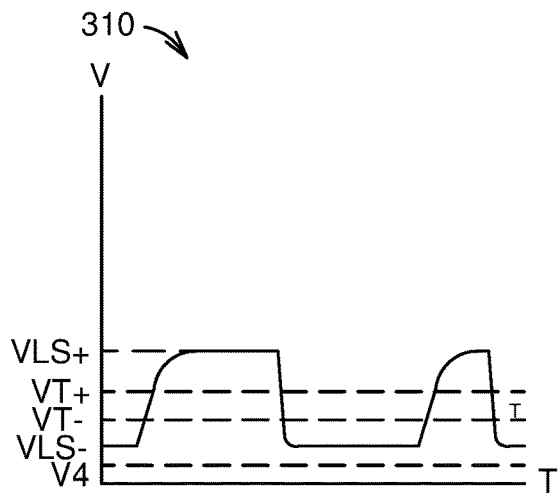
FIG. 7C shows a graph of a signal waveform and the noise and threshold margins on the low-voltage side of the first example of a sensor-based interface during digital reception by the digital unit of data from another digital unit.
Figure 7E:
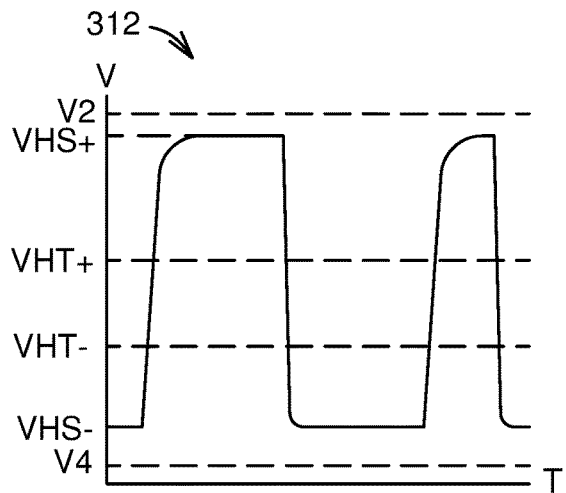
FIG. 7E shows a graph of a signal waveform and the noise and threshold margins on the high-voltage side of the first example of a sensor-based interface during digital reception of data from the digital unit by another digital unit.
Figure 7D:
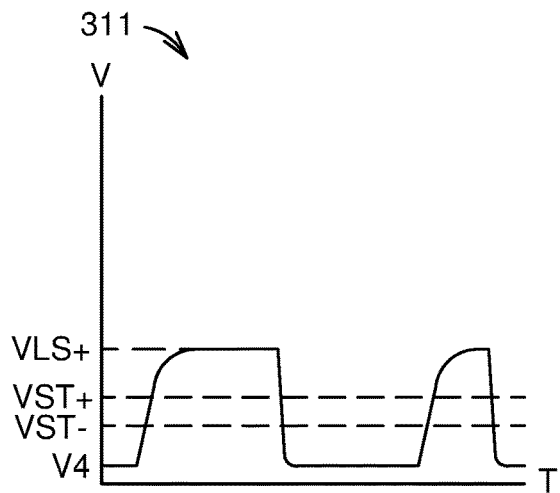
FIG. 7D shows a graph of a signal waveform and the noise and threshold margins on the low-voltage side of the first example of a sensor-based interface during digital transmission of data from the digital unit to another digital unit.

An electrical schematic diagram of a first example 300 of a sensing-based circuit 250 is shown in FIG. 7A. First example 300 may be identical to sensing-based circuit 250, but in FIG. 7A the sensing-based interface 251 of FIG. 6 is replaced with a first-example sensing interface 301, which is an example of sensing-based interface 251.

Within first-example sensing interface 301 first divider resistor 103 and second divider resistor 104 may comprise the voltage attenuator 252 described with reference to FIG. 6. First divider resistor 103 may be connected at one end to second node 8 and at another end to a divider node 302. Second divider resistor 104 may be connected at one end to divider node 302 and at another end to electrical potential V4.

Low-side pull-up resistor 152, a current-sensing resistor 303, and a functional amplifier 304 may constitute the sensing circuit 254 described with reference to FIG. 6. Low-side pull-up resistor 152 may be connected at one end to low-voltage node 111 and at another end to an electrical potential V8. Current-sensing resistor 303 may be connected at one end to low-voltage node 111 and at another end to divider node 302.

Functional amplifier 304, may be an operational amplifier or a comparator as they are commonly known in the art and may have a non-inverting input 305, an inverting input 306, and an output 307. Functional amplifier 304 may be powered in such a way that the electrical potential at its output 307 may be substantially equal to electrical potential V2 whenever the electrical potential at a non-inverting input 305 of functional amplifier 304 is substantially positive with respect to the electrical potential at an inverting input 306 and the electrical potential at output 307 may be substantially equal to electrical potential V4 whenever the electrical potential at non-inverting input 305 is substantially negative with respect to the electrical potential at inverting input 306.

In the example of FIG. 7A, non-inverting input 305 of functional amplifier 304 may be connected to low-voltage node 111, and inverting input 306 may be connected to divider node 302.

A switching diode 308, with its cathode connected to output 307 of functional amplifier 304 and its anode connected to second node 8, may constitute the sensing-based switch 253 described with reference to FIG. 6.

With proper choices of component values and characteristics and of electrical potential V8 applied to low-side pullup resistor 152, first-example sensing interface 301 may function as follows. If second switch 15 is open, low-voltage node 111, which is connected to non-inverting input 305 may, by virtue of positive bias current through low-side pullup resistor 152, be substantially positive in electrical potential with respect to divider node 302, which is connected to inverting input 306. Consequently, output 307 of functional amplifier 304 will be driven to a potential substantially equal to electrical potential V2, and switching diode 308, the anode of which is connected to a more negative potential at second node 8, may act as an open circuit. In this condition, the potential at low-voltage node 111 may differ by only a small potential drop, that across current-sensing resistor 303, from the attenuated version at divider node 302 of the potential at second node 8. Hence, the potential difference across digital port 101 may be an attenuated version of the potential difference across the end 105 of transmission line 5, much as is the case in voltage-dividing digital communications circuit 100 shown in FIG. 3A.

If, on the other hand, second switch 15 is closed, the electrical potential at low-voltage node 111 may be substantially equal to electrical potential V4. Any substantially positive electrical potential at second node 8 with respect to electrical potential V4 may result in the potential at divider node 302, which is connected to inverting input 306, being substantially positive with respect to the electrical potential at low-voltage node 111, which is connected to non-inverting input 305. As a result, the electrical potential at output 307 of functional amplifier 304 may be substantially equal to electrical potential V4. If nothing else connected to transmission line 5 is dragging the potential at second node 8 downward toward electrical potential V4, the potential difference between second node 8 and fourth node 11 may be substantially equal to the forward voltage of switching diode 308. This forward voltage may be sufficiently low for the purpose of sending a low signal on transmission line 5 to other nodes but sufficiently high to assure that the electrical potential at divider node 302 will remain substantially more positive than the electrical potential at low-voltage node 111, thereby ensuring that the electrical potential at output 307 of functional amplifier 304 will remain low.

First-example high-voltage transmission graph 309, first-example low-voltage reception graph 310, first-example low-voltage transmission graph 311, and first-example high-voltage reception graph 312 for first example 300 are displayed in FIGS. 7B, 7C, 7D, and 7E in the same format as are the amplifier-scaling-interface high-voltage transmission graph 217, amplifier-scaling-interface low-voltage reception graph 218, amplifier-scaling-interface low-voltage transmission graph 219, and amplifier-scaling-interface high-voltage reception graph 220 in FIGS. 5B, 5C, 5D, and 5E respectively. The component values for which the first-example performance graphs apply are as follows. Second pull-up resistor 19 has a value of 100 kilohms, first divider resistor 103 has a value of 1 megohm, second divider resistor 104 has a value of 500 kilohms, current-sensing resistor 303 has a value of 50 kilohms, and low-side pullup resistor 152 has a value of 20 megohms. Electrical potential V2 and electrical potential V8 are both assumed to be 10 volts relative to electrical potential V4. Also, it is assumed that one-hundred nodes identical to first example 300 are attached to transmission line 5, each sourcing current through its pull-up resistor, and that the total current flowing through switching diode 308 and functional amplifier output 307 produces a forward voltage drop of 1.1 volts whenever the potential difference between non-inverting input 305 and inverting input 306 of functional amplifier 304 is substantially negative. Finally, it is assumed that second digital unit 4 has a negative-going threshold potential with respect to electrical potential V4 of 1.3 volts and a positive-going threshold voltage with respect to electrical potential V4 of 2.0 volts. The resulting noise margin and threshold margin for signals on transmission line 5 are 2.30 volts and 2.45 volts respectively.

Figure 8A:
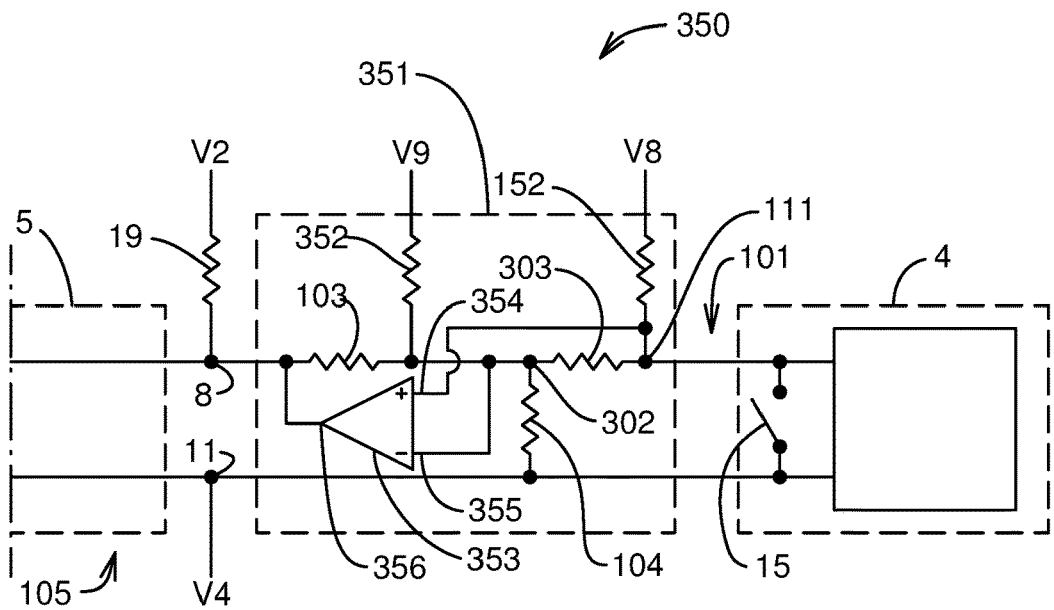
FIG. 8A shows a circuit diagram of a second example of a sensor-based circuit.
Figure 8B:
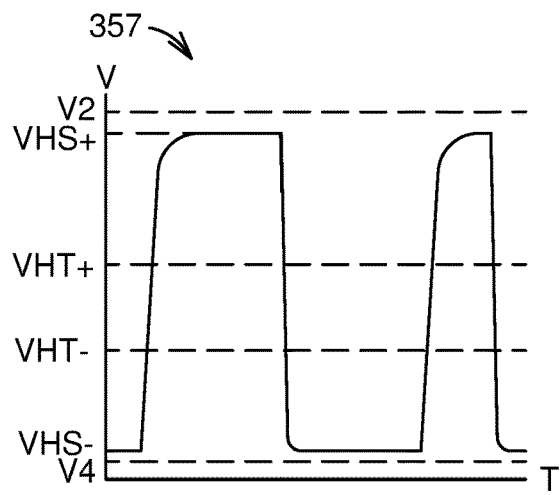
FIG. 8B shows a graph of a signal waveform and the noise and threshold margins on the high-voltage side of the second example of a sensor-based interface during digital transmission to the digital unit of data from another digital unit.
Figure 8C:
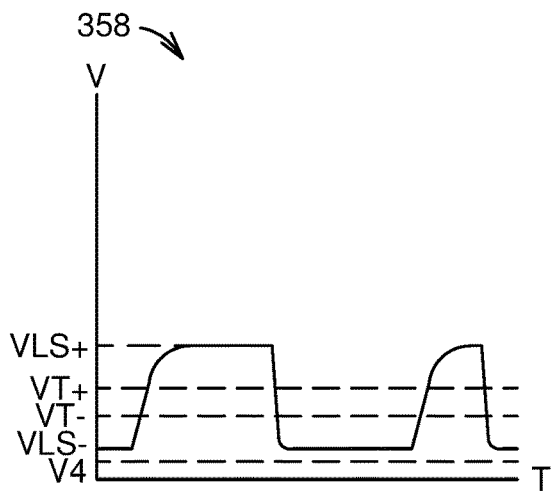
FIG. 8C shows a graph of a signal waveform and the noise and threshold margins on the low-voltage side of the second example of a sensor-based interface during digital reception by the digital unit of data from another digital unit.
Figure 8E:
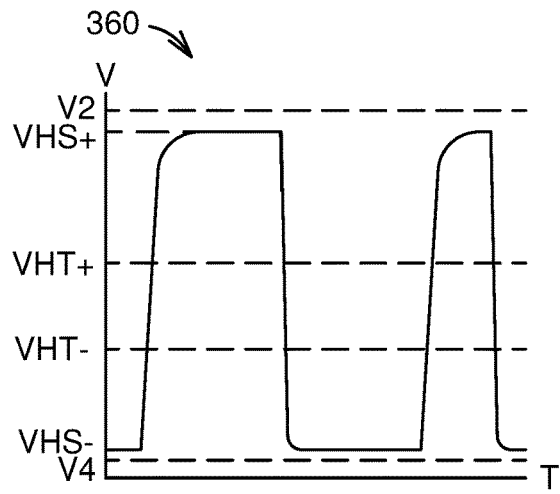
FIG. 8E shows a graph of a signal waveform and the noise and threshold margins on the high-voltage side of the second example of a sensor-based interface during digital reception of data from the digital unit by another digital unit.
Figure 8D:
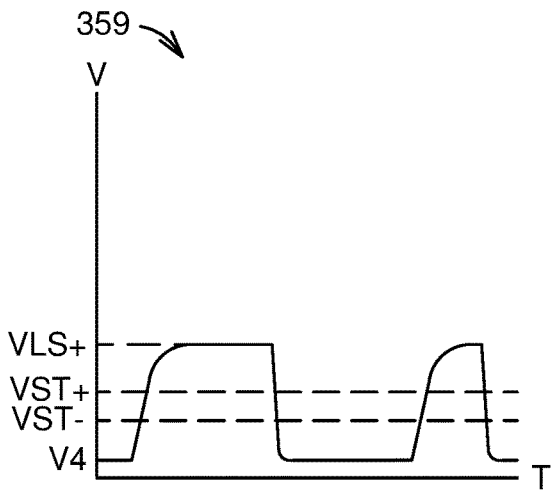
FIG. 8D shows a graph of a signal waveform and the noise and threshold margins on the low-voltage side of the second example of a sensor-based interface during digital transmission of data from the digital unit to another digital unit.

FIG. 8A shows an electrical schematic diagram of a second example 350 of a sensing-based circuit 250. Second example 350 is identical to first example 300 except for the following three changes found within a second sensing interface 351. First, the switching diode 308 in first example 300 in FIG. 7A is not included in second example 350. Second, unlike first example 300, second example 350 includes, as part of the sensing circuit 254 described with reference to FIG. 6, a second bias resistor 352 electrically connected at one end to divider node 302 and at the other end to a substantially constant electrical potential V9 maintained by external circuitry (not shown). Third, in place of functional amplifier 304 shown in FIG. 7A, second example 350 may have a switching amplifier 353. Switching amplifier 353 may have characteristics similar to those of an open-drain or open-collector operational amplifier or comparator as they are known in the art. I.e., when switching amplifier 353 is properly powered, if the potential difference between a switching amplifier non-inverting input 354 and a switching amplifier inverting input 355 of switching amplifier 353 is substantially positive, a switching amplifier output 356 of switching amplifier 353 is held at a potential close to electrical potential V4 while sinking current up to a substantial limit. If the potential difference between switching amplifier non-inverting input 354 and switching amplifier inverting input 355 is substantially negative, on the other hand, switching amplifier output 356 becomes an open circuit. Switching amplifier output 356 thus behaves, without the need for a switching diode 308, as the sensing-based switch 253 previously described with reference to FIG. 6.

The purpose of second bias resistor 352 is to keep the potential at divider node 302 substantially positive with respect to the potential at low-voltage node 111 when the electrical potential at second node 8 is being held close to electrical potential V4 by virtue of the closure of second switch 15. The potential at second node 8 in second example 350 is thus allowed to drop closer to electrical potential V4 than it is in first example 300, and the noise margin in second example 350 may consequently be higher than the noise margin in first example 300.

Second-example high-voltage transmission graph 357, second-example low-voltage reception graph 358, second-example low-voltage transmission graph 359, and second-example high-voltage reception graph 360 for second example 350 are displayed in FIGS. 8B, 8C, 8D, and 8E in the same format as are the first-example high-voltage transmission graph 309, first-example low-voltage reception graph 310, first-example low-voltage transmission graph 311, and first-example high-voltage reception graph 312 for first example 300 in FIGS. 7B, 7C, 7D, and 7E respectively. The results shown are for components with the following characteristics. The values of all of the resistors shown in FIG. 7A are unchanged for the corresponding resistors in FIG. 8A, and the threshold potentials of second digital unit 4 are unchanged. The value of second bias resistor 352 is 40 megohms. Electrical potentials V2, V8, and V9 are all equal to positive 10 volts with respect to electrical potential V4. Under the current sinking load presented to switching amplifier output 356 when second switch 15 is closed, the potential at switching amplifier output 356 is 0.3 volts positive with respect to electrical potential V4. Under these conditions the noise margin and threshold margin for signals on transmission line 5 are 2.88 volts and 2.50 volts respectively.

Figure 9A:
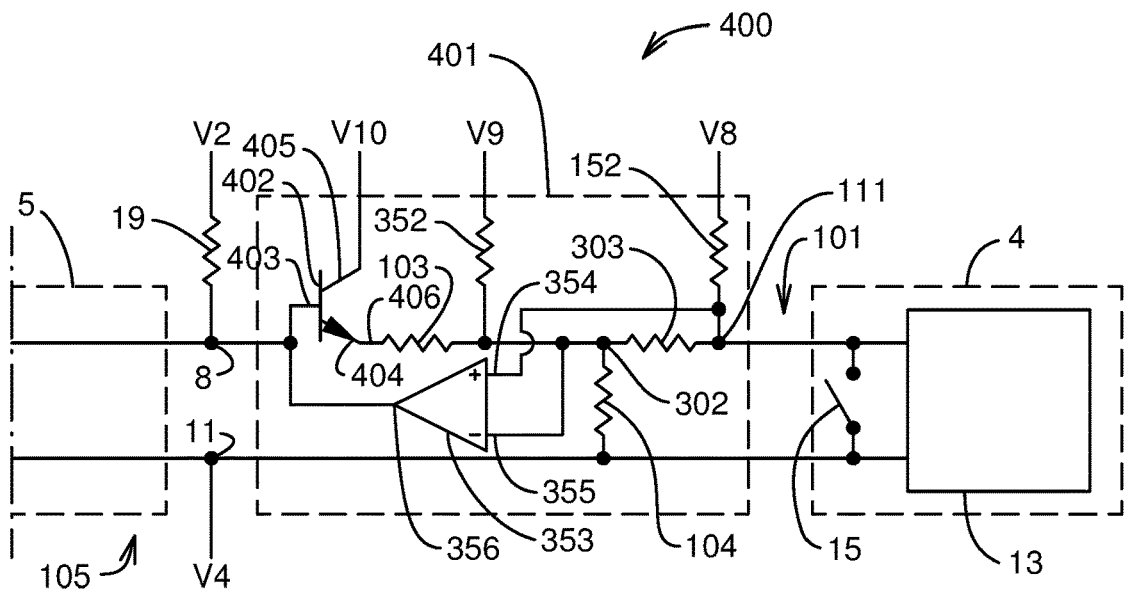
FIG. 9A shows a circuit diagram of a third example of a sensor-based circuit.
Figure 9B:
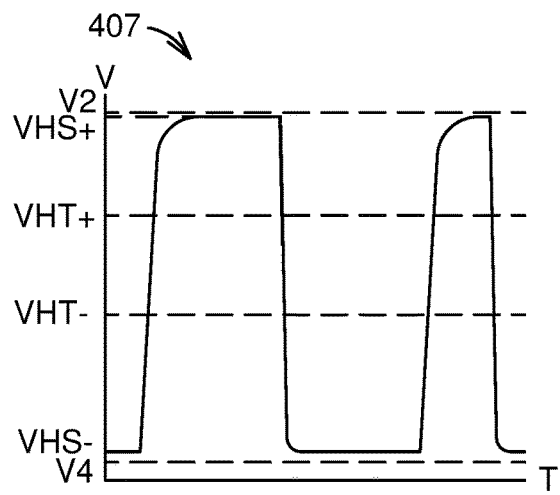
FIG. 9B shows a graph of a signal waveform and the noise and threshold margins on the high-voltage side of the third example of a sensor-based interface during digital transmission to the digital unit of data from another digital unit.
Figure 9C:
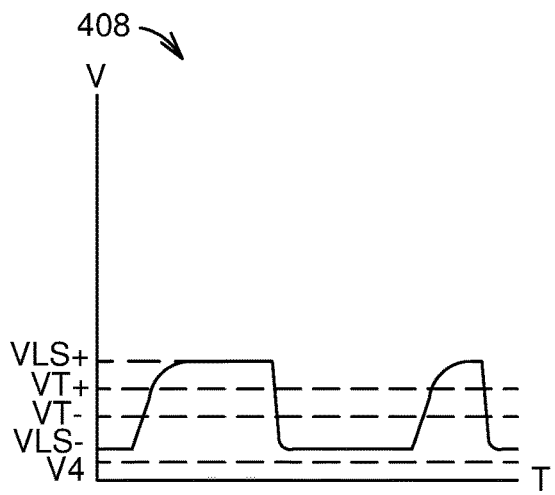
FIG. 9C shows a graph of a signal waveform and the noise and threshold margins on the low-voltage side of the third example of a sensor-based interface during digital reception by the digital unit of data from another digital unit.
Figure 9E:
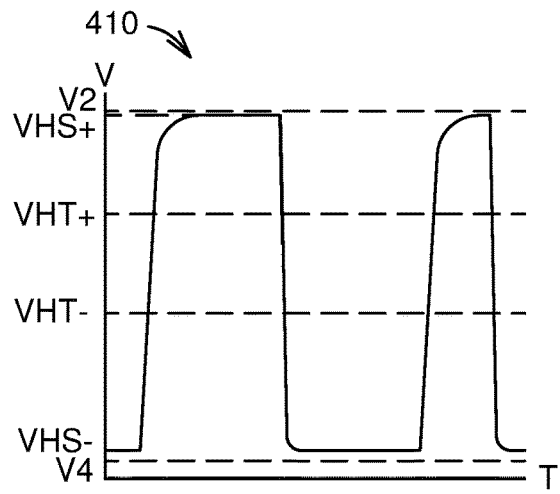
FIG. 9E shows a graph of a signal waveform and the noise and threshold margins on the high-voltage side of the third example of a sensor-based interface during digital reception of data from the digital unit by another digital unit.
Figure 9D:
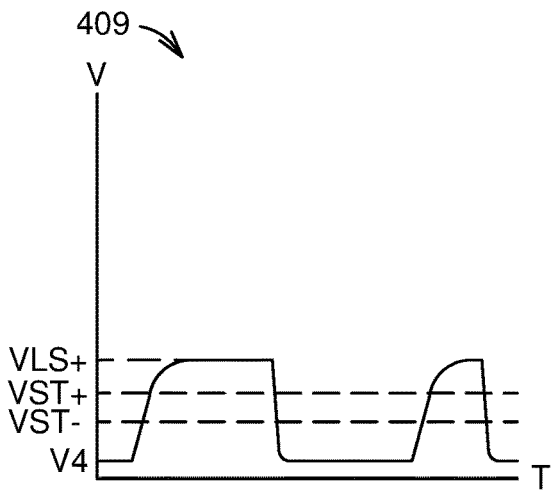
FIG. 9D shows a graph of a signal waveform and the noise and threshold margins on the low-voltage side of the third example of a sensor-based interface during digital transmission of data from the digital unit to another digital unit.

An electrical schematic diagram of a third example 400 of a sensing-based circuit 250 is shown in FIG. 9A. Third example 400 is identical in topology to second example 350, but with the addition within third sensing interface 401 of an impedance-raising device 402 and the disconnection of an input end 406 of first divider resistor 103 from second node 8. Impedance-raising device 402 may have a control electrode 403, a non-inverting output electrode 404, and an at least one power electrode 405. Non-inverting output electrode 404 may be connected to the input end 406 of first divider resistor 103, control electrode 403 may be connected to second node 8, and an at least one power electrode 405 may be connected to an electrical potential V10 maintained by external circuitry (not shown). Connected in this way, impedance-raising device 402 may be considered part of the voltage attenuator 252 described previously in reference to FIG. 6.

Impedance-raising device 402 may be an electrical device with two particular properties. The first property may be that, with the at least one power electrode 405 each connected to a proper electrical potential V10 maintained by external circuitry (not shown), the control electrode 403 may present a higher electrical impedance to the node to which control electrode 403 is connected electrically than is presented by the node to which non-inverting output electrode 404 is connected electrically. The second property may be that the electrical potential on non-inverting output electrode 404 may follow closely the electrical potential on control electrode 403 as the latter is varied over a usable range. Impedance-raising device 402 may be, for example, but not exclusively, an NPN or PNP bipolar junction transistor, a P-channel or N-channel junction field-effect transistor or metal-oxide-semiconductor field-effect transistor, or an operational amplifier configured as an input follower.

Incorporating impedance-raising device 402 into third sensing interface 401 makes it possible to lower the resistance values of all of the resistors within third sensing interface 401 while reducing the amount of electrical current drawn from second node 8 and thereby increasing the maximum potential achievable at second node 8 when second switch 15 is open. The lower resistance values may allow third sensing interface 401 to accommodate lower impedances or higher leakage currents in second switch 15 and/or the digital port of second digital circuit 13.

Third-example high-voltage transmission graph 407, third-example low-voltage reception graph 408, third-example low-voltage transmission graph 409, and third-example high-voltage reception graph 410 for third example 400 are displayed in FIGS. 9B, 9C, 9D, and 9E in the same format as are the first-example high-voltage transmission graph 309, first-example low-voltage reception graph 310, first-example low-voltage transmission graph 311, and first-example high-voltage reception graph 312 for first example 300 in FIGS. 7B, 7C, 7D, and 7E respectively. The results shown are for components with the following characteristics. Second pull-up resistor 19 has a value of 100 kilohms, first divider resistor 103 has a value of 27 kilohms, second divider resistor 104 has a value of 11 kilohms, current-sensing resistor 303 has a value of 2 kilohms, low-side pullup resistor 152 has a value of 470 kilohms, and second bias resistor 352 has a value of 1 megohm. Electrical potentials V2, V8, V9, and V10 are all equal to positive 10 volts with respect to electrical potential V4. Under the current sinking load presented to switching amplifier output 356 of switching amplifier 353 when second switch 15 is closed, the potential at switching amplifier output 356 is 0.3 volts positive with respect to electrical potential V4. Impedance-raising device 402 is an NPN transistor with a forward current transfer ratio of 200 and a base-emitter voltage of 0.6 volts. The threshold potentials of second digital unit 4 are unchanged from those in the first example 300 previously discussed with reference to FIG. 7A. Under these conditions the noise margin and threshold margin for signals on transmission line 5 are 2.81 volts and 2.84 volts respectively.

Figure 10:
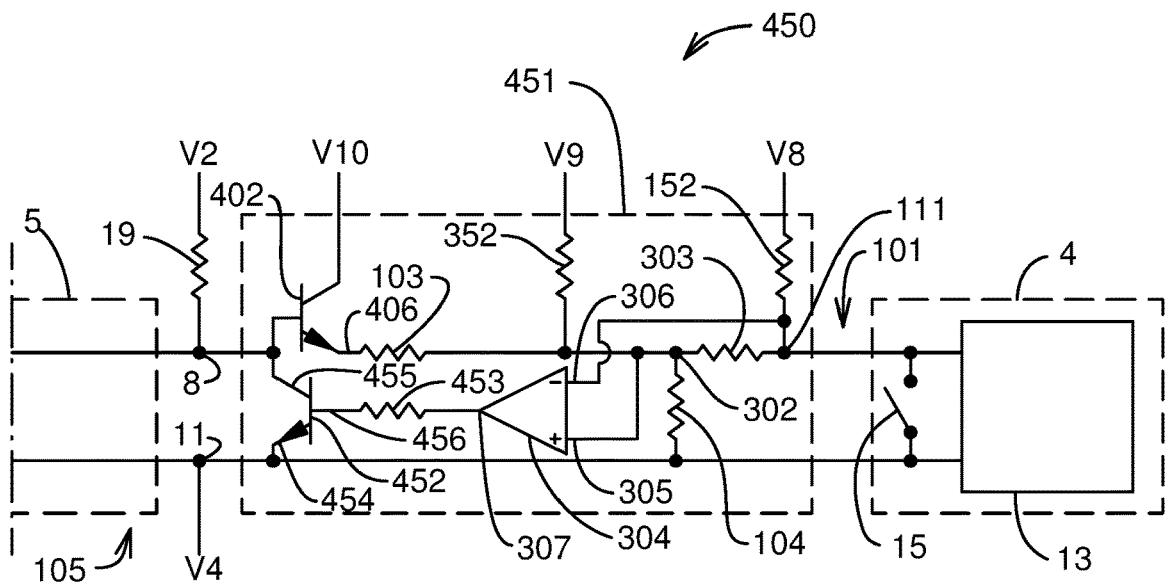
FIG. 10 shows an example of a circuit diagram of an interface that includes a switching transistor and a current-limiting element that may reduce the rate of discharge of the transmission line to reduce ringing and may enable the interface to withstand higher voltages that may on occasion be present on the transmission line.

An electrical schematic diagram of a fourth example 450 of a sensing-based circuit 250 is shown in FIG. 10. Fourth example 450 may be identical in topology to third example 400, except with the following changes. There may be an addition within a fourth sensing interface 451 of a switching transistor 452 and, in some examples, a current-limiting resistor 453. Switching amplifier 353 in third example 400 may be replaced with a functional amplifier 304, which is described with respect to first example 300 in FIG. 7A. If switching transistor 452 is included and is a voltage inverting device, the electrical connections to non-inverting input 305 and inverting input 306 of functional amplifier 304 may be interchanged, as shown in FIG. 10, relative to the electrical connections shown in FIG. 7A. Switching transistor 452 may be, for example, an NPN bipolar junction transistor. It may have an emitter 454 electrically connected to fourth node 11 held at electrical potential V4, it may have a collector 455 electrically connected to second node 8, and it may have a base 456 connected electrically through current-limiting resistor 453 to output 307 of functional amplifier 304.

Together, current-limiting resistor 453 and switching transistor 452 may comprise the sensing-based switch 253 described previously with reference to FIG. 6. Closure of second switch 15 may result in an electrical potential at divider node 302 that is substantially positive with respect to the electrical potential at low-voltage node 111. As a result, non-inverting input 305 of functional amplifier 304 may be presented with an electrical potential substantially more positive than the electrical potential presented to inverting input 306, and the output 307 of functional amplifier 304 may be driven to an electrical potential close to electrical potential V2 and substantially more positive with respect to electrical potential V4 than the forward base-emitter voltage of switching transistor 452. A current limited by current-limiting resistor 453 may flow through the base-emitter junction of switching transistor 452 allowing an even larger current to flow from second node 8 through collector 455 to emitter 454 and into fourth node 11. The electrical potential at second node 8 may thus be dropped to a level close to electrical potential V4, the difference being as low as the saturation collector-emitter voltage of switching transistor 452.

Opening of second switch 15, on the other hand, may result in the presentation of an electrical potential to non-inverting input 305 that is substantially more negative than the electrical potential presented to inverting input 306, and the output 307 of functional amplifier 304 may, as a result, be driven to a potential closer to electrical potential V4 than the base-emitter forward voltage of switching transistor 452. Collector 455 may then draw substantially no current, allowing the electrical potential at second node 8 to be controlled by second pull-up resistor 19 and any other nodes that may be electrically connected to transmission line 5.

The current that switching transistor 452 may be capable of sinking from second node 8 may be limited to an amount equal to the current through current-limiting resistor 453 multiplied by the forward current transfer ratio of switching transistor 452. This current-limitation feature may serve multiple purposes. For one, the limited current may discharge transmission line 5 at a controlled rate, reducing the effects of electromagnetic reflections and ringing on transmission line 5. Reflections and ringing on transmission line 5 may, under some circumstances, result in bit errors or may produce pulses of negative voltage and current that may damage nodes connected to transmission line 5. Reducing the rate at which potential changes may occur on transmission line 5 can be observed in simulations to reduce the amplitudes of potential perturbations caused by reflections and ringing.

A second purpose served by the current-limitation feature may be to provide a measure of protection of fourth sensing interface 451 against high positive potentials that may be accidentally applied to transmission line 5 or that may result from interference or surges. Given a high positive potential on second node 8 relative to fourth node 11, the maximum power dissipated in switching transistor 452 will be approximately equal to the potential difference between second node 8 and fourth node 11 multiplied by the current sunk by collector 455. Limiting this current thus limits the maximum power dissipated in switching transistor 452. Without sufficient limitation of the current, the power dissipated in switching transistor 452 may be sufficient to damage switching transistor 452.

In some implementations of fourth example 450 current-limiting resistor 453 may have a value substantially equal to zero ohms or may be replaced with a conductor, providing functional amplifier 304 has a current output that is sufficiently limited by functional amplifier 304 itself.

Performance graphs and the noise and threshold margins for third example 400 apply equally to fourth example 450 under the following conditions. First, the resistors in fourth example 450 that are common to third example 400 may have the same values as the values that they have in third example 400. Second, current-limiting resistor 453 may have a value of 3 kilohms. Third, switching transistor 452 may have a forward current transfer ratio of 100 and a collector-emitter saturation voltage of 0.3 volts. Fourth, all of the electrical potentials V2, V4, V8, V9, and V10 and the threshold potentials of second digital unit 4 are the same in fourth example 450 as in third example 400.

The current limit for current sinking by switching transistor 452 can be highly variable from one unit to another, because it is substantially proportional to the forward current transfer ratio of switching transistor 452, and the forward current transfer ratio of a bipolar junction transistor may vary, in typical parts, over a greater than three-to-one range.

Figure 11:
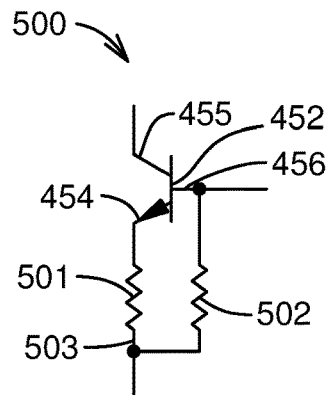
FIG. 11 shows a circuit diagram of an example of an enhancement to the switching transistor that may result in more precise current limiting.

As is well known to those skilled in the electronics art, a more tightly controlled current limit may be achieved through the addition of a negative feedback resistor in series with the emitter of the transistor. This purpose may be served if a three-terminal circuit 500 in FIG. 11 is substituted for switching transistor 452 in the fourth sensing interface 451 shown in FIG. 10. Three-terminal circuit 500 may comprise a switching transistor 452 with a feedback resistor 501 connected in series with an emitter 454 and a voltage-dropping resistor 502 connected from base 456 to a distal end 503 of feedback resistor 501. In substituting three-terminal circuit 500 for switching transistor 452 of FIG. 10, collector 455 and base 456 may be connected electrically to second node 8 and current-limiting resistor 453 respectively as shown in FIG. 10, and distal end 503 may be connected electrically to fourth node 11.

A current sinking limit of approximately 31 milliamperes through collector 455 and a minimum electrical potential difference between second node 8 and fourth node 11 of approximately 0.26 volts with 10 mA current flowing into collector 455 may be achieved when three-terminal circuit 500 is substituted into fourth sensing interface 451 as described, provided the components have the following characteristics. First, all of the components of fourth example 450 may have the characteristics called out previously in connection with the applicability of the performance graphs in FIGS. 8B, 8C, 8D, and 8E, except that the collector-emitter saturation voltage and the base-emitter forward voltage of switching transistor 452 may be 0.04 volts and 0.7 volts respectively. Second, the value of feedback resistor 501 may be 22 ohms. Third, the value of voltage-dropping resistor 502 may be 510 ohms.

In systems in which digital units communicate with each other over a distance through electrical conductors, the electrical conductors behave as transmission lines. On transmission lines reflections and ringing, which can cause bit errors, are problems that may have to be solved to permit error-free communications. Frequently, the solution employed is to terminate each end of a transmission line with an impedance equal to the characteristic impedance of the transmission line. In practical cables usable as low-cost transmission lines the characteristic impedance is typically in the range of 50 to 150 ohms. A transmission line 5 terminated with 150 ohms at each end would present a direct-current resistance of 75 ohms, which, if pulled up to 10 volts, for example, would consume approximately 1.3 watts of power in the terminating resistances alone. Additional power would be consumed in the pull-up resistors 19. Such a waste of power is undesirable in many applications.

To reduce to a negligible level the effects of transmission line reflections and ringing without the need to waste power and without the complications of having to install terminations at each end of a transmission line, more than one technique may be applied in conjunction with the previously discussed methods for increasing noise margin and threshold margin. A first technique is the limiting of current for charging and discharging of the capacitance of transmission line 5. Use of a sensing-based switch 253 (FIG. 6) that sinks a sufficiently limited amount of current, as was discussed with reference to fourth example 450 in FIG. 10 and three-terminal circuit 500 in FIG. 11, may serve to limit the rate at which transmission line 5 is discharged when second switch 15 is closed. Use of a high resistance value in second pull-up resistor 19 may serve to limit the rate at which transmission line 5 is charged when second switch 15 is opened. Employing these current limitations may overcome the effects of reflections and ringing if the charge and discharge times are sufficiently long compared to the ringing intervals. The technique of lengthening the charge and/or discharge time may have a negative effect on the maximum rate at which bits can be communicated along transmission line 5 through the digital-unit interface, but this technique may be acceptable if the application allows the lowered bit rates.

Figure 12:
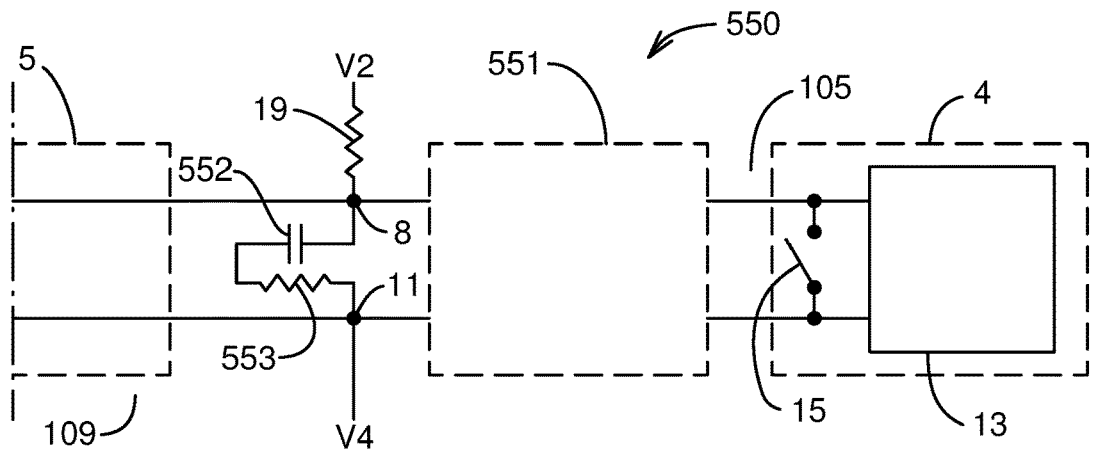
FIG. 12 shows an example of the addition of a series-connected capacitor and resistor across the end of the transmission line, which addition may reduce ringing on the transmission line.

When the length of transmission line 5, and consequently its capacitance, varies from one application to another, the charge and discharge rates may vary accordingly. FIG. 12 shows a consistency-enhancing circuit 550 including an arbitrary margin-enhancing interface 551, a parallel capacitor 552, and a damping resistor 553. Margin-enhancing interface 551 may, for example, be an amplifier-scaling interface 201 (as in FIG. 5A), sensing-based interface 251 (as in FIG. 6, 7A, 8A, 9A, or 10) or any other interface that realizes increased noise margin and/or threshold margin. Parallel capacitor 552 may be large enough in value to overshadow the intrinsic capacitance of transmission line 5. If damping resistor 553 is small enough in value or equal to zero in value, the charge and discharge rates of transmission line 5 may vary little with transmission line length due to the dominance of parallel capacitor 552. If second pull-up resistor 19, parallel capacitor 552 and damping resistor 553 are included as part of consistency-enhancing circuit 550, then the electrical connection of multiple similar consistency-enhancing circuits 550 in parallel with transmission line 5 at various points along the length of transmission line 5 will increase the capacitance across transmission line 5 and the charging current through the pull-up resistors proportionately, thereby maintaining a constant charging rate.

Proper choice of the value of damping resistor 553 introduces losses into transmission line 5 that can reduce ringing. For example, if 100 nodes identical to consistency-enhancing circuit 550 are spaced 0.2 meters apart from end to end along transmission line 5 with a transmission line characteristic impedance of 130 ohms and a propagation velocity of 0.75 times the speed of light in free space; if second pull-up resistor 19, parallel capacitor 552, and damping resistor 553 have values of 100 kilohms, 220 picofarads, and 100 ohms respectively; and if electrical potential V2 is 10 volts positive with respect to electrical potential V4; then the amplitude of spurious ringing due to reflections on transmission line 5 resulting from the closing of sensing-based switch 253 (see FIG. 6) at one of the ends of transmission line 5 with no current limit may be observed in simulations to settle to a level below 2.7 volts in approximately 1.5 microseconds.

Circuits such as first and second digital circuits 12 and 13 in FIG. 1 may be microcontrollers or other units that tolerate only a limited range, for example −0.3 to +4.1 volts, of electrical potentials at their input/output ports with respect to ground. A potential difference outside of this range on transmission line 5, whether accidentally applied or induced as surges due to lightning storms, electromagnetic interference, reflections, or other causes, may damage the digital circuit.

The inputs and outputs of amplifiers, such as first and second difference amplifiers 202 and 203 in FIG. 5A, functional amplifier 304 in FIG. 7A and FIG. 10, and switching amplifier 353 in FIG. 8A and FIG. 9A frequently can withstand higher voltages than can a typical microcontroller, and resistors such as first divider resistor 103 in FIGS. 7 through 10 can limit currents and reduce the potential drop appearing across the less hardy digital circuits, such as second digital circuit 13. Protection against negative potentials and currents up to certain levels may be offered by impedance-raising device 402 and switching transistor 452 in FIG. 10.

Figure 13:
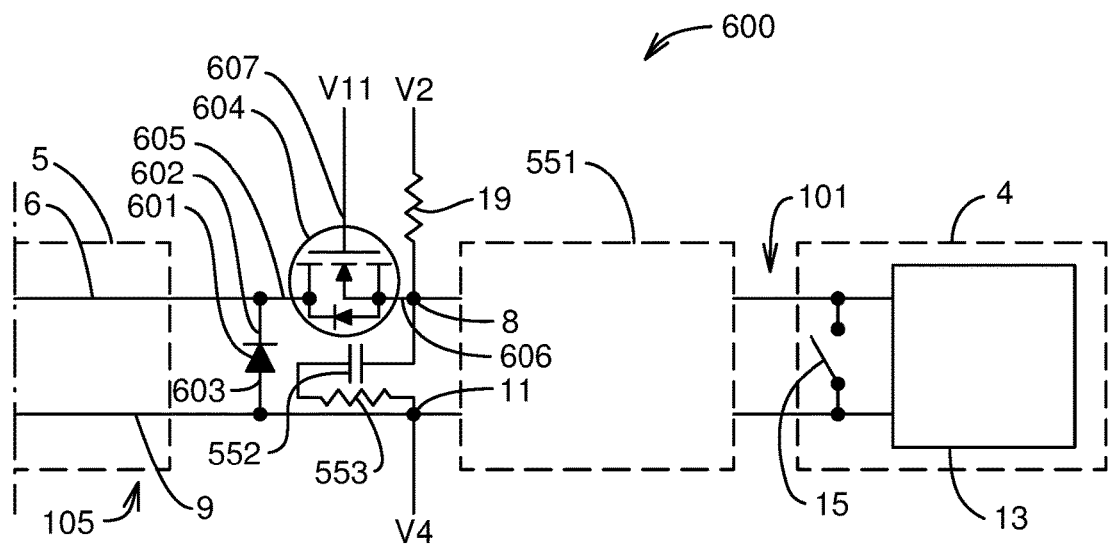
FIG. 13 shows by example how a MOSFET and/or a diode may be inserted at the transmission line connection to protect the interface circuitry and the low-voltage communication port from high positive potentials and from negative potentials and currents that may on occasion appear on the transmission line.

A further addition to a digital-unit interface may add more protection. Shown as an example in FIG. 13 is a strongly-protected circuit 600, which is identical to consistency-enhancing circuit 550, except with the addition of a snubbing diode 601, with a cathode 602 electrically connected to signal conductor 6 and an anode 603 electrically connected to return conductor 9 on transmission line 5, and/or a voltage-limiting metal-oxide-semiconductor field-effect transistor (MOSFET) 604 interrupting the connection between signal conductor 6 and second node 8, with a drain electrode 605 electrically connected to signal conductor 6 on transmission line 5, a source electrode 606 electrically connected to second node 8, and a gate electrode 607 maintained at a substantially constant electrical potential V11.

Snubbing diode 601, when connected as described, will, within the current capacity of snubbing diode 601, limit the negative electrical potential on signal conductor 6 with respect to the electrical potential on return conductor 9 to a magnitude no greater than the forward conduction voltage of snubbing diode 601. A typical forward conduction voltage under 1 volt may be sufficient to prevent damage to arbitrary margin-enhancing interface 551 due to excitations on transmission line 5 producing currents through snubbing diode 601 as high as several amperes, which is beyond the current capacities of many potential sources of negative current.

Voltage-limiting MOSFET 604, if it is an N-channel device, when connected as described, may, over a range of positive potentials on signal conductor 6 up to the sum of electrical potential V2 and the drain-to-source breakdown voltage of voltage-limiting MOSFET 604, prevent the potential at second node 8 from exceeding a value equal to electrical potential V11 minus the gate threshold voltage of voltage-limiting MOSFET 604. For example, if voltage-limiting MOSFET 604 has a drain-to-source breakdown voltage of 60 volts and a gate threshold voltage of 1.6 volts, and if electrical potentials V2 and V11 are 10 volts and 15 volts respectively with respect to electrical potential V4, then a potential of up to 70 volts on signal conductor 6 may result in a potential no higher than 13.4 volts on second node 8 and may produce no damage to an arbitrary margin-enhancing interface 551 that is capable of withstanding potentials of up to 13.4 volts with respect to electrical potential V4. Meanwhile, with positive electrical potentials on signal conductor 6 and on second node 8 ranging from 0 volts to electrical potential V2, voltage-limiting MOSFET 604 may be in its on state, allowing the potentials at second node 8 and on signal conductor 6 to be substantially equal to each other and therefore allowing normal operation of arbitrary margin-enhancing interface 551.

It follows that the incorporation of snubbing diode 601 and voltage-limiting MOSFET 604 as shown within strongly-protected circuit 600 may protect the circuitry within strongly-protected circuit 600 from damage over a wide range of negative and positive excitations of transmission line 5.

Figure 14:
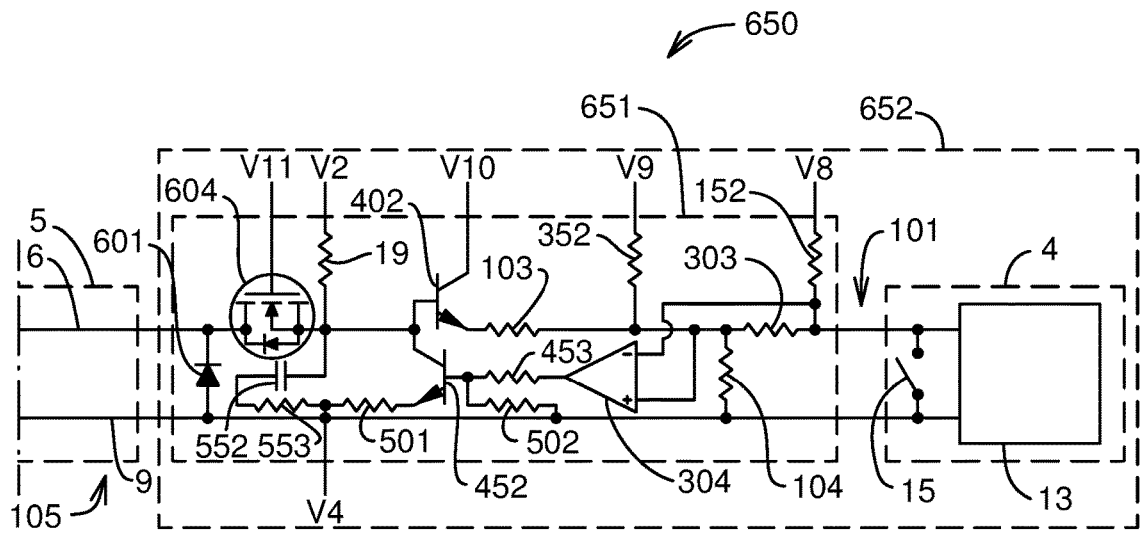
FIG. 14 shows an example of a preferred embodiment of a digital transceiver incorporating the ideas of FIGS. 10 through 13.

An example of a preferred embodiment of strongly-protected circuit 600 is shown as a high-margin protected circuit 650 in FIG. 14. It combines the innovations of FIGS. 10 through 13. The numerical designators of the various elements in FIG. 14 are the same as the numerical designators for the corresponding elements in FIGS. 10 through 13.

A high-margin protected interface 651 intermediates between end 105 of transmission line 5 and digital port 101 of second digital unit 4.

In FIG. 14 the portion of high-margin protected circuit 650 excluding transmission line 5 constitutes a hardened transceiver 652. Hardened transceiver 652 is hardened in the electronic sense, being more immune to noise, interference, surges, misconnections, transmission line reflections, and power shortages than would be an unmodified digital unit such as second digital unit 4.

Figure 15:
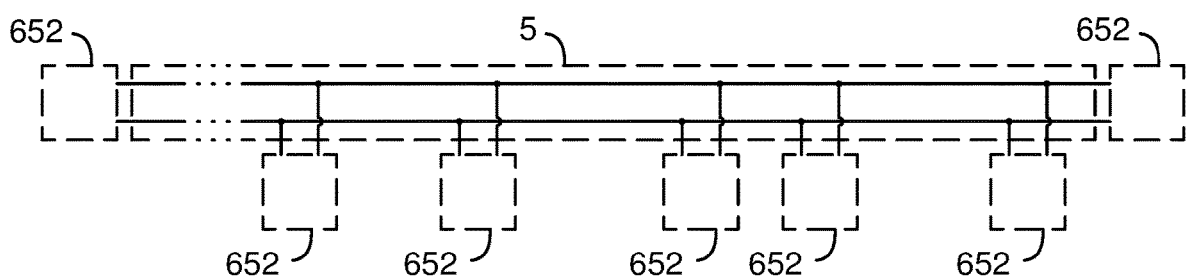
FIG. 15 shows an example of a transmission line with multiple transceivers connected to it in various positions along its length.

As shown in FIG. 15, multiple instances of hardened transceiver 652 may be connected at various positions along transmission line 5. It is a property of hardened transceiver 652 that the noise margin, threshold margin, and speed performance for communications along transmission line 5 may be only mildly dependent on the number of instances of hardened transceiver 652 connected to transmission line 5. The same may be true of hardened transceivers similar to hardened transceiver 652 but with high-margin protected interface 651 replaced with other interfaces incorporating the ideas previously described with reference to FIGS. 5 through 13.

Hardened transceiver units may include digital units similar to second digital unit 4 but having multiple instances of digital port 101, in which case there may be a separate instance of an arbitrary margin-enhancing interface 551 connected to each instance of digital port 101 and connected to a separate instance of transmission line 5. The separate instances of transmission line 5 may be merged into a single multi-conductor transmission line with one instance of a signal conductor 6 connected to each instance of arbitrary margin-enhancing interface 551 and with a single return conductor 9 connected to all of the instances of arbitrary margin-enhancing interface 551.

Accordingly, while embodiments have been particularly shown and described, many variations may be made therein. Other combinations of features, functions, elements, and/or properties may be used. Such variations, whether they are directed to different combinations or directed to the same combinations, whether different, broader, narrower, or equal in scope, are also included.

The remainder of this section describes additional aspects and features of a digital-unit interface presented without limitation as a series of paragraphs, some or all of which may be alphanumerically designated for clarity and efficiency. Each of these paragraphs can be combined with one or more other paragraphs, and/or with disclosure from elsewhere in this application, including the materials incorporated by reference, in any suitable manner. Some of the paragraphs below expressly refer to and further limit other paragraphs, providing without limitation examples of some of the suitable combinations.

A1. A digital-unit interface comprising:

a first node configured to be connected to one end of a pull-up resistor, the pull-up resistor having another end connected to a first reference electrical potential, the first node being configured to be connected to a signal line of a transmission line connected to a first digital unit at a distal point on the transmission line, the first digital unit applying a high electrical potential alternating with a low electrical potential to the signal line of the transmission line during communication with a second digital unit;

a second node configured to be connected to a second reference electrical potential, to a signal-return line of the transmission line, and to a signal-return line of the second digital unit, the second reference electrical potential being less than the first reference electrical potential;

a third node configured to be connected to a signal line of the second digital unit, the second digital unit presenting between its signal line and its signal-return line a closed circuit alternating with an open circuit while the second digital unit is transmitting to the first digital unit and a continuous open circuit while the second digital unit is not transmitting to the first digital unit; and an amplifier assembly configured to be connected between the first node and the third node, the amplifier assembly configured to transform between the high electrical potential on the first node and a medium electrical potential on the third node, the medium electrical potential being less than the high electrical potential and greater than the second reference electrical potential, and the amplifier assembly including at least a first amplifier having an input connected to the third node, the amplifier assembly being configured so that the electrical potential on the first node is dependent at least in part on an output of the first amplifier.

A2. The digital-unit interface of paragraph A1, wherein a non-inverting input of the first amplifier is connected to the third node, the output of the first amplifier is connected to the first node, the at least a first amplifier further includes a second amplifier, the first and second amplifiers being difference amplifiers, and the second amplifier has a non-inverting input connected to the first node and an output connected to the third node.

A3. The digital-unit interface of paragraph A2, wherein the first amplifier includes an inverting input connected to a third reference potential and the second amplifier includes an inverting input connected to a fourth reference potential, the third reference potential being less than the fourth reference potential.

A4. The digital-unit interface of paragraph A3, wherein the first amplifier includes a reference terminal connected to the fourth reference potential and the second amplifier includes a reference terminal connected to the third reference potential.

A5. The digital-unit interface of paragraph A4, wherein the fourth reference potential is less than the first reference potential.

A6. The digital-unit interface of paragraph A2, wherein the amplifier assembly further includes a rectifier connecting the output of the first amplifier to the first node.

A7. The digital-unit interface of paragraph A2, wherein the amplifier assembly further includes a first output resistance connecting the output of the second amplifier to the third node.

A8. The digital-unit interface of paragraph A7, wherein the amplifier assembly further includes a second output resistance connecting the output of the first amplifier to the first node.

A9. The digital-unit interface of paragraph A1, wherein the amplifier assembly further includes a voltage attenuator, a switch, and a sensing circuit, the voltage attenuator is configured to reduce an electrical potential on the first node to a lower electrical potential on the third node, the sensing circuit includes the first amplifier of the at least a first amplifier, the sensing circuit is responsive to a change in the impedance between the signal line and the signal-return line of the second digital unit for operating the switch, and the switch is operable to change selectively the electrical potential of the first node to within a threshold of the electrical potential of the second node when the second digital unit presents between its signal line and its signal-return line a short circuit and to not change the electrical potential of the first node when the second digital unit presents between its signal line and its signal-return line an open circuit.

A10. The digital-unit interface of paragraph A9, wherein the sensing circuit further includes a first resistor connected at one end to the third node and at the other end to a fourth node, the voltage attenuator includes a second resistor connected between the fourth node and the second node and a third resistor connected between the fourth node and a fifth node, an inverting input of the first amplifier is connected to the fourth node, and a non-inverting input of the first amplifier is connected to the third node.

A11. The digital-unit interface of paragraph A10, wherein the fifth node is connected to the first node.

A12. The digital-unit interface of paragraph A10, wherein the sensing circuit further includes a fourth resistor connected at one end to the third node and at the other end to a third reference electrical potential.

A13. The digital-unit interface of paragraph A10, wherein the switch includes a diode having an anode connected to the first node and a cathode connected to the output of the first amplifier.

A14. The digital-unit interface of paragraph A10, wherein the amplifier assembly includes a switching amplifier, the switching amplifier including the first amplifier and the switch, an output of the switching amplifier being connected to the first node.

A15. The digital-unit interface of paragraph A10, wherein the sensing circuit further includes a fifth resistor connected at one end to the fourth node and at the other end to a fourth reference electrical potential.

A16. The digital-unit interface of paragraph A10, wherein the voltage attenuator further includes an active device having a non-inverting electrode connected to the fifth node and a control electrode connected to the first node, the active device being configured to produce impedance between the first node and the fifth node when the non-inverting electrode is conducting current.

A17. The digital-unit interface of paragraph A9, wherein the sensing circuit further includes a first resistor connected at one end to the third node and at the other end to a fourth node, the voltage attenuator includes a second resistor connected between the fourth node and the second node and a third resistor connected between the fourth node and a fifth node, a non-inverting input of the first amplifier is connected to the fourth node, and an inverting input of the first amplifier is connected to the third node.

A18. The digital-unit interface of paragraph A17, wherein the fifth node is connected to the first node.

A19. The digital-unit interface of paragraph A17, wherein the sensing circuit further includes a fourth resistor connected at one end to the third node and at the other end to a third reference electrical potential.

A20. The digital-unit interface of paragraph A17, wherein the sensing circuit further includes a fifth resistor connected at one end to the fourth node and at the other end to a fourth reference electrical potential.

A21. The digital-unit interface of paragraph A17, wherein the voltage attenuator further includes an active device having a non-inverting electrode connected to the fifth node and a control electrode connected to the first node, the active device being configured to produce impedance between the first node and the fifth node when the non-inverting electrode is conducting current.

A22. The digital-unit interface of paragraph A17, wherein the switch includes a voltage-inverting transistor having an inverting electrode connected to the first node, a non-inverting electrode connected to the second node, and a control electrode connected to the output of the first amplifier.

A23. The digital-unit interface of paragraph A17, wherein the switch includes a voltage-inverting transistor having an inverting electrode connected to the first node, a non-inverting electrode connected to the second node, and a control electrode and further includes a sixth resistor having one end connected to the output of the first amplifier and another end connected to the control electrode of the voltage-inverting transistor.

A24. The digital-unit interface of paragraph A17, wherein the switch includes a voltage-inverting transistor having an inverting electrode, a non-inverting electrode, and a control electrode and further includes a sixth resistor having one end connected to the output of the first amplifier and another end connected to the control electrode of the voltage-inverting transistor, a seventh resistor having one end connected to the second node and another end connected to the non-inverting electrode of the voltage-inverting transistor, and an eighth resistor having one end connected to the second node and another end connected to the control electrode of the voltage-inverting transistor.

A25. The digital-unit interface of paragraph A1, wherein the configuration of the first node includes a safeguard circuit having a first terminal connected to the first node, a second terminal connected to the second node, and a third terminal configured to be connected to a signal line of a transmission line.

A26. The digital-unit interface of paragraph A25, wherein the safeguard circuit includes a damping resistor connected at one end to the first terminal and at another end to an intermediate node and a damping capacitor connected at one end to the intermediate node and at another end to the second terminal.

A27. The digital-unit interface of paragraph A25, wherein the safeguard circuit includes a damping capacitor connected at one end to the first terminal and at another end to an intermediate node and a damping resistor connected at one end to the intermediate node and at another end to the second terminal.

A28. The digital-unit interface of paragraph A25, wherein the safeguard circuit includes an active device having a non-inverting electrode connected to the first terminal, an inverting electrode connected to the third terminal, and a control electrode connected to a safeguard reference potential.

A29. The digital-unit interface of paragraph A25, wherein the safeguard circuit includes a safeguard diode connected at one end to the third terminal and at another end to the second terminal.

A30. A digital-unit interface comprising:
a first node configured to be connected to one end of a pull-up resistor, the pull-up resistor having another end connected to a first reference electrical potential, the first node being configured to be connected to a signal line of a transmission line connected to a first digital unit at a distal point on the transmission line, the first digital unit applying a high electrical potential alternating with a low electrical potential to the signal line of the transmission line during communication with a second digital unit;
a second node configured to be connected to a second reference electrical potential, to a signal-return line of the transmission line, and to a signal-return line of the second digital unit, the second reference electrical potential being less than the first reference electrical potential;
a third node configured to be connected to a signal line of the second digital unit, the second digital unit presenting between its signal line and its signal-return line a closed circuit alternating with an open circuit while the second digital unit is transmitting to the first digital unit and a continuous open circuit while the second digital unit is not transmitting to the first digital unit; and an amplifier assembly configured to be connected between the first node and the third node, the amplifier assembly configured to transform between the high electrical potential on the first node and a medium electrical potential on the third node, the medium electrical potential being less than the high electrical potential and greater than the second reference electrical potential, the amplifier assembly including a switch and a sensing circuit, and the sensing circuit including an amplifier, the sensing circuit being responsive to a change in the impedance between the signal line and the signal-return line of the second digital unit for operating the switch, the sensing circuit configured to close the switch whenever the second digital unit is presenting between its signal line and its signal-return line a closed circuit and to open the switch whenever the second digital unit is presenting between its signal line and its signal-return line an open circuit.

INDUSTRIAL APPLICABILITY

The methods and apparatus described in the present disclosure are applicable to the internet-of-things (IOT) industry; the digital sensor industry; the factory control industry; the indoor and greenhouse agricultural and horticultural industries; the general, decorative, outdoor, and specialty lighting industries; the automotive, transportation, and aerospace industries; and any other industries in which digital communication is required over wires, especially where significant sources of noise, interference, or surges are present and/or the potential exists for misconnections that could burn out expensive-to-replace electronics and/or where it is desired that power consumption be minimized.

What is claimed is:

1. A digital-unit interface comprising:
a first node configured to be connected to one end of a pull-up resistor, the pull-up resistor having another end connected to a first reference electrical potential, the first node being configured to be connected to a signal line of a transmission line connected to a first digital unit at a distal point on the transmission line, the first digital unit applying a high electrical potential alternating with a low electrical potential to the signal line of the transmission line during communication with a second digital unit;
a second node configured to be connected to a second reference electrical potential, to a signal-return line of the transmission line, and to a signal-return line of the second digital unit, the second reference electrical potential being less than the first reference electrical potential;
a third node configured to be connected to a signal line of the second digital unit, the second digital unit presenting between its signal line and its signal-return line a closed circuit alternating with an open circuit while the second digital unit is transmitting to the first digital unit and a continuous open circuit while the second digital unit is not transmitting to the first digital unit; and
an amplifier assembly configured to be connected between the first node and the third node, the amplifier assembly configured to transform between the high electrical potential on the first node and a medium electrical potential on the third node, the medium electrical potential being less than the high electrical potential and greater than the second reference electrical potential, and the amplifier assembly including at least a first amplifier having an input connected to the third node, the amplifier assembly being configured so that the electrical potential on the first node is dependent at least in part on an output of the first amplifier.

2. The digital-unit interface of claim 1, wherein a non-inverting input of the first amplifier is connected to the third node, the output of the first amplifier is connected to the first node, the at least a first amplifier further includes a second amplifier, the first and second amplifiers being difference amplifiers, and the second amplifier has a non-inverting input connected to the first node and an output connected to the third node.

3. The digital-unit interface of claim 2, wherein the first amplifier includes an inverting input connected to a third reference potential and the second amplifier includes an inverting input connected to a fourth reference potential, the third reference potential being less than the fourth reference potential.

4. The digital-unit interface of claim 3, wherein the first amplifier includes a reference terminal connected to the fourth reference potential and the second amplifier includes a reference terminal connected to the third reference potential.

5. The digital-unit interface of claim 4, wherein the fourth reference potential is less than the first reference potential.

6. The digital-unit interface of claim 2, wherein the amplifier assembly further includes a rectifier connecting the output of the first amplifier to the first node.

7. The digital-unit interface of claim 2, wherein the amplifier assembly further includes a first output resistance connecting the output of the second amplifier to the third node.

8. The digital-unit interface of claim 7, wherein the amplifier assembly further includes a second output resistance connecting the output of the first amplifier to the first node.

9. The digital-unit interface of claim 1, wherein the amplifier assembly further includes a voltage attenuator, a switch, and a sensing circuit, the voltage attenuator is configured to reduce an electrical potential on the first node to a lower electrical potential on the third node, the sensing circuit includes the first amplifier of the at least a first amplifier, the sensing circuit is responsive to a change in the impedance between the signal line and the signal-return line of the second digital unit for operating the switch, and the switch is operable to change selectively the electrical potential of the first node to within a threshold of the electrical potential of the second node when the second digital unit presents between its signal line and its signal-return line a short circuit and to not change the electrical potential of the first node when the second digital unit presents between its signal line and its signal-return line an open circuit.

10. The digital-unit interface of claim 9, wherein the sensing circuit further includes a first resistor connected at one end to the third node and at the other end to a fourth node, the voltage attenuator includes a second resistor connected between the fourth node and the second node and a third resistor connected between the fourth node and a fifth node, an inverting input of the first amplifier is connected to the fourth node, and a non-inverting input of the first amplifier is connected to the third node.

11. The digital-unit interface of claim 10, wherein the fifth node is connected to the first node.

12. The digital-unit interface of claim 10, wherein the sensing circuit further includes a fourth resistor connected at one end to the third node and at the other end to a third reference electrical potential.

13. The digital-unit interface of claim 10, wherein the switch includes a diode having an anode connected to the first node and a cathode connected to the output of the first amplifier.

14. The digital-unit interface of claim 10, wherein the amplifier assembly includes a switching amplifier, the switching amplifier including the first amplifier and the switch, an output of the switching amplifier being connected to the first node.

15. The digital-unit interface of claim 10, wherein the sensing circuit further includes a fifth resistor connected at one end to the fourth node and at the other end to a fourth reference electrical potential.

16. The digital-unit interface of claim 10, wherein the voltage attenuator further includes an active device having a non-inverting electrode connected to the fifth node and a control electrode connected to the first node, the active device being configured to produce impedance between the first node and the fifth node when the non-inverting electrode is conducting current.

17. The digital-unit interface of claim 9, wherein the sensing circuit further includes a first resistor connected at one end to the third node and at the other end to a fourth node, the voltage attenuator includes a second resistor connected between the fourth node and the second node and a third resistor connected between the fourth node and a fifth node, a non-inverting input of the first amplifier is connected to the fourth node, and an inverting input of the first amplifier is connected to the third node.

18. The digital-unit interface of claim 17, wherein the fifth node is connected to the first node.

19. The digital-unit interface of claim 17, wherein the sensing circuit further includes a fourth resistor connected at one end to the third node and at the other end to a third reference electrical potential.

20. The digital-unit interface of claim 17, wherein the sensing circuit further includes a fifth resistor connected at one end to the fourth node and at the other end to a fourth reference electrical potential.

21. The digital-unit interface of claim 17, wherein the voltage attenuator further includes an active device having a non-inverting electrode connected to the fifth node and a control electrode connected to the first node, the active device being configured to produce impedance between the first node and the fifth node when the non-inverting electrode is conducting current.

22. The digital-unit interface of claim 17, wherein the switch includes a voltage-inverting transistor having an inverting electrode connected to the first node, a non-inverting electrode connected to the second node, and a control electrode connected to the output of the first amplifier.

23. The digital-unit interface of claim 17, wherein the switch includes a voltage-inverting transistor having an inverting electrode connected to the first node, a non-inverting electrode connected to the second node, and a control electrode and further includes a sixth resistor having one end connected to the output of the first amplifier and another end connected to the control electrode of the voltage-inverting transistor.

24. The digital-unit interface of claim 17, wherein the switch includes a voltage-inverting transistor having an inverting electrode, a non-inverting electrode, and a control electrode and further includes a sixth resistor having one end connected to the output of the first amplifier and another end connected to the control electrode of the voltage-inverting transistor, a seventh resistor having one end connected to the second node and another end connected to the non-inverting electrode of the voltage-inverting transistor, and an eighth resistor having one end connected to the second node and another end connected to the control electrode of the voltage-inverting transistor.

25. The digital-unit interface of claim 1, wherein the configuration of the first node includes a safeguard circuit having a first terminal connected to the first node, a second terminal connected to the second node, and a third terminal configured to be connected to a signal line of a transmission line.

26. The digital-unit interface of claim 25, wherein the safeguard circuit includes a damping resistor connected at one end to the first terminal and at another end to an intermediate node and a damping capacitor connected at one end to the intermediate node and at another end to the second terminal.

27. The digital-unit interface of claim 25, wherein the safeguard circuit includes a damping capacitor connected at one end to the first terminal and at another end to an intermediate node and a damping resistor connected at one end to the intermediate node and at another end to the second terminal.

28. The digital-unit interface of claim 25, wherein the safeguard circuit includes an active device having a non-inverting electrode connected to the first terminal, an inverting electrode connected to the third terminal, and a control electrode connected to a safeguard reference potential.

29. The digital-unit interface of claim 25, wherein the safeguard circuit includes a safeguard diode connected at one end to the third terminal and at another end to the second terminal.

30. A digital-unit interface comprising:
a first node configured to be connected to one end of a pull-up resistor, the pull-up resistor having another end connected to a first reference electrical potential, the first node being configured to be connected to a signal line of a transmission line connected to a first digital unit at a distal point on the transmission line, the first digital unit applying a high electrical potential alternating with a low electrical potential to the signal line of the transmission line during communication with a second digital unit;
a second node configured to be connected to a second reference electrical potential, to a signal-return line of the transmission line, and to a signal-return line of the second digital unit, the second reference electrical potential being less than the first reference electrical potential;
a third node configured to be connected to a signal line of the second digital unit, the second digital unit presenting between its signal line and its signal-return line a closed circuit alternating with an open circuit while the second digital unit is transmitting to the first digital unit and a continuous open circuit while the second digital unit is not transmitting to the first digital unit; and
an amplifier assembly configured to be connected between the first node and the third node, the amplifier assembly configured to transform between the high electrical potential on the first node and a medium electrical potential on the third node, the medium electrical potential being less than the high electrical potential and greater than the second reference electrical potential, the amplifier assembly including a switch and a sensing circuit, and the sensing circuit including an amplifier, the sensing circuit being responsive to a change in the impedance between the signal line and the signal-return line of the second digital unit for operating the switch, the sensing circuit configured to close the switch whenever the second digital unit is presenting between its signal line and its signal-return line a closed circuit and to open the switch whenever the second digital unit is presenting between its signal line and its signal-return line an open circuit.

* * * * *